(12) United States Patent
Takabayashi

(10) Patent No.: US 7,366,220 B2
(45) Date of Patent: Apr. 29, 2008

(54) TUNABLE LASER

(75) Inventor: Kazumasa Takabayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/235,250

(22) Filed: Sep. 27, 2005

(65) Prior Publication Data

US 2006/0209911 A1    Sep. 21, 2006

(30) Foreign Application Priority Data

| Mar. 17, 2005 | (JP) | ............................. 2005-077891 |
| Mar. 17, 2005 | (JP) | ............................. 2005-077892 |
| Jul. 6, 2005 | (JP) | ............................. 2005-197818 |
| Jul. 6, 2005 | (JP) | ............................. 2005-197883 |

(51) Int. Cl.
  *H01S 3/08* (2006.01)
(52) U.S. Cl. ...................... 372/102; 372/20; 372/50.11
(58) Field of Classification Search ................ 372/102, 372/20, 50.1, 50.11
  See application file for complete search history.

(56) References Cited

U.S. PATENT DOCUMENTS

| 4,665,528 | A | * | 5/1987 | Chinone et al. | ............... | 372/96 |
| 4,932,034 | A | * | 6/1990 | Usami et al. | ................. | 372/96 |
| 5,177,758 | A | | 1/1993 | Oka et al. | ....................... | 372/50 |
| 5,274,649 | A | * | 12/1993 | Hirayama et al. | ............ | 372/20 |
| 5,358,898 | A | | 10/1994 | Ogita et al. | .................. | 437/129 |
| 5,379,318 | A | * | 1/1995 | Weber | .......................... | 372/96 |
| 5,808,314 | A | | 9/1998 | Nakajima et al. | ............. | 257/17 |
| 5,838,714 | A | * | 11/1998 | Delorme | ....................... | 372/96 |
| 7,106,765 | B2 | * | 9/2006 | Carter et al. | ................... | 372/20 |

FOREIGN PATENT DOCUMENTS

| EP | 0 267 667 | A2 | 5/1988 |
| EP | 0 487 351 | A2 | 5/1992 |

(Continued)

OTHER PUBLICATIONS

R. Paoletti, et al.; "Small chip size, low power consumption, fully electronic controlled tunable laser source with 40 nm tuning range and 20 mW output power for WDM applications;" *ECOC-IOOC 2003 Proceedings*; vol. 4; Paper Th1.2.4; 2003; pp. 886-887./Discussed in the specification.
Y. Kotaki, et al.; "Tunable, Narrow-Linewidth and High-Power λ/4-Shifted DFB Laser;" *Electronics Letters*; vol. 25; No. 15; Jul. 20, 1989; pp. 990-992./Discussed in the specification.
Patent Abstract of Japan vol. 011, No. 108 (E-495), Apr. 4, 1987 & JP 61 255085 A (Mitsubishi Electric Corp), Nov. 12, 1986 abstract figure 1.
European Search Report dated Feb. 16, 2006.

*Primary Examiner*—Minsun Oh Harvey
*Assistant Examiner*—Xinning (Tom) Niu
(74) *Attorney, Agent, or Firm*—Kratz, Quintos & Hanson, LLP

(57) ABSTRACT

A tunable laser includes an optical waveguide alternately including a gain waveguide portion and a wavelength controlling waveguide portion, and a diffraction grating. The diffraction grating includes a gain diffraction grating and a wavelength controlling diffraction grating. A wavelength controlling region is configured such that the wavelength controlling waveguide portion and the wavelength controlling diffraction grating are included therein. A gain region is configured such that the gain waveguide portion and the gain diffraction grating are included therein. The Bragg wavelength of the wavelength controlling region is longer than that of the gain region in a state in which current injection or voltage application is not performed for the wavelength controlling waveguide portion.

17 Claims, 23 Drawing Sheets

FOREIGN PATENT DOCUMENTS

| | | |
|---|---|---|
| EP | 0 608 729 A1 | 8/1994 |
| EP | 0 926 787 A1 | 6/1999 |
| JP | 4-147686 | 5/1992 |
| JP | 7-273400 | 10/1995 |
| JP | 9-36480 | 2/1997 |
| JP | 2004-235600 | 8/2004 |

\* cited by examiner

TUNABLE LASER

CROSS REFERENCE TO RELATED APPLICATIONS

This application is based on and hereby claims priorities to Japanese Applications No. 2005-077891 filed on Mar. 17, 2005, No. 2005-077892 filed on Mar. 17, 2005, No. 2005-197818 filed on Jul. 6, 2005, and No. 2005-197883 filed on Jul. 6, 2005 in Japan, the contents of which are hereby incorporated by reference.

BACKGROUND OF THE INVENTION

1) Field of the Invention

This invention relates to a semiconductor laser for use as a light source for optical communication, and more particularly to a tunable laser which can vary the oscillation wavelength over a wide range at a high speed.

2) Description of the Related Art

Together with remarkable increase of communication demands in recent years, development of wavelength division multiplex communication systems (WDM communication systems) wherein a plurality of signal lights having wavelengths different from each other are multiplexed to implement high capacity transmission using a single optical fiber have been and are being proceeded.

In such a wavelength division multiplex communication system as just described, in order to implement a flexible and advanced communication system, a tunable laser capable of selecting a desired wavelength over a wide wavelength range at a high speed is required intensely.

For example, as a tunable laser capable of continuously varying the oscillation wavelength, a 3-electrode DBR (Distributed Bragg Reflector) laser, a TTG-DFB (Tunable Twin Guide-Distributed Feedback) laser and so forth have been proposed.

As shown in FIG. 22, a 3-electrode DBR laser 100 includes an active layer section 101, a phase controlling section 102, and a DBR section 104 in which a diffraction grating 103 is formed along an optical waveguide. The active layer section 101, phase controlling section 102 and DBR section 104 are disposed in series. Further, electrodes 105, 106 and 107 are provided for the active layer section 101, phase controlling section 102 and DBR section 104, respectively, so that they can inject current independently of each other. Further, a common electrode 108 connected to the ground potential is provided on a face opposite to a face of the 3-electrode DBR laser 100 on which the electrodes 105, 106 and 107 are provided. Current $I_{act}$ is injected into the active layer section 101 through the electrode 105; current Ips is injected into the phase controlling section 102 through the electrode 106; and current (wavelength controlling current) $I_{DBR}$ is injected into the DBR section 104 through the electrode 107.

On the other hand, as shown in FIG. 23, a TTG-DFB laser 110 includes an active waveguide 111 for generating a gain when current is injected therein and a wavelength controlling waveguide 112 for having a refractive index which varies when current is injected into the wavelength controlling waveguide 112 to vary the oscillation wavelength. The TTG-DFB laser 110 is structured such that the active waveguide 111 is laminated (stacked) on the wavelength controlling waveguide 112 with an intermediate layer 113 interposed therebetween. Further, a diffraction grating 114 is formed along the active waveguide 111 and the wavelength controlling waveguide 112 over the entire length of the waveguides 111 and 112. Further, an electrode 115 for injecting current $I_{act}$ into the active waveguide 111 is provided on an upper side surface of the TTG-DFB laser 110, and an electrode 116 for injecting current $I_{tune}$ into the wavelength controlling waveguide 112 is provided on a lower side surface of the TTG-DFB laser 110. Further, the intermediate layer 113 is connected to the ground potential. Consequently, current injection into the active waveguide 111 and the wavelength controlling waveguide 112 can be performed independently of each other.

Further, as a technique for implementing a wide band tunable laser, for example, also an array integration type tunable laser has been proposed wherein a plurality of tunable lasers having a wavelength variable range within several nm to 10 and several nm are integrated on the same substrate.

For example, in ECOC 2003 PROCEEDING, vol. 4, p. 887 (Th1.2.4), a laser wherein DBR lasers as a tunable laser are integrated is proposed. Further, in Japanese Patent Laid-Open No. 2004-235600, a laser wherein TTG-DFB lasers as a tunable laser are integrated is proposed.

In such an array integration type tunable laser as just described, in order to perform wavelength variable operation over a wide wavelength range at a high speed, it is demanded to expand the wavelength variable range of each of tunable lasers to be integrated and raise the speed of wavelength variable operation.

For example, where the 3-electrode DBR laser 100 or the TTG-DFB laser 110 described above is used for integration as a tunable laser, since the 3-electrode DBR laser 100 and the TTG-DFB laser 110 can vary the oscillation wavelength thereof by current injection into the phase controlling section 102 or the wavelength controlling waveguide 112, the wavelength can be varied at a high speed (for example, 10 nanosecond or less).

On the other hand, as the wavelength variable range of each of the tunable lasers to be integrated, it has been reported that, in the case of the DBR laser, the wavelength variable range can be expanded to approximately 10 nm, and, in the case of the TTG-DFB laser, the wavelength variable range can be expanded to approximately 7 nm. In this instance, if 4 to 7 tunable lasers are integrated on one array integration type tunable laser, then the wavelength variable operation can be performed within a range from 1,530 nm to 1,560 nm (C band) which is important in WDM communication systems.

Incidentally, in the DBR laser, if current (wavelength controlling current) is injected in order to vary the oscillation wavelength, then the Bragg wavelength and the longitudinal mode wavelength are gradually displaced from each other, and mode hopping occurs. Therefore, in order to implement continuous variation of the oscillation wavelength while appearance of mode hopping is prevented, it is necessary to provide the phase controlling section 102 on which a diffraction grating is not formed similarly as in the 3-electrode DBR laser 100 described above such that current is injected into the phase controlling section 102 so that the Bragg wavelength and the longitudinal mode wavelength can be made coincide with each other.

However, in the 3-electrode DBR laser 100 having such a configuration as described above, not only control of the reflection wavelength at the DBR section 104 but also phase control by the phase controlling section 102 are required. Consequently, control is complicated.

Therefore, as a technique for eliminating the necessity for control of the phase, it has been proposed to contrive the configuration of an electrode for injecting current into a distribution Bragg reflection region or the length of an active waveguide or an inactive waveguide for adjusting the phase (for example, refer to Japanese Patent Laid-Open No. Hei 9-36480). Further, a structure has been proposed wherein an active region and an inactive region are disposed alternatively and periodically along a propagation direction of light while a region in which a diffraction grating is formed and a region in which a diffraction grating is not formed are disposed in the same period (for example, refer to Japanese Patent Laid-Open No. Hei 7-273400).

It is to be noted that, as a different tunable laser which uses current for control and can continuously vary the oscillation wavelength without suffering from mode hopping, for example, a multiple electrode DFB (Distributed Feed Back) laser has been proposed (for example, Electronics Letters 20th, Jul. 1989, Vol. 25, No. 15, pp. 990-992, Japanese Patent Laid-Open No. Hei 4-147686).

SUMMARY OF THE INVENTION

Incidentally, as described hereinabove, in the DBR laser, in order to make it possible to vary the oscillation wavelength continuously while appearance of mode hopping is prevented, phase control by the phase control section 102 is required in addition to control of the reflection wavelength by the DBR section 104. In this instance, two parameters are required for the wavelength control, and this complicates the control. Therefore, it is difficult to perform the wavelength control at a high speed.

On the other hand, in the technique disclosed in Japanese Patent Laid-Open No. Hei 9-36480 mentioned hereinabove, the resonance longitudinal mode wavelength and the Bragg wavelength can be varied at an equal rate only by injecting equal current into the comb-like electrode for injecting current into the distribution reflection waveguide and the electrode in the inactive waveguide region for adjusting the phase. However, control of the phase for making the resonance longitudinal mode wavelength and the Bragg wavelength coincide with each other at first is required, and this control is complicated. Particularly with an array integration type tunable laser, control upon changeover between lasers is complicated, and it is difficult to perform wavelength control at a high speed.

On the other hand, in the TTG-DFB laser, no mode hopping occurs. However, since it is necessary to provide the intermediate layer 113 between the active waveguide 111 and the wavelength controlling waveguide 112 so that current can be injected into the active waveguide 111 and the wavelength controlling waveguide 112 independently of each other as described above and connect the intermediate layer 113 to the ground potential, a fabrication process which is more complicated than that for an ordinary laser is required for fabrication of the device. Particularly, it is difficult to fabricate an array integration type tunable laser in which such TTG-DFB lasers are integrated.

Meanwhile, the multiple electrode DFB laser described above requires integration of more than 10 lasers in order to cover the entire C band which is important for WDM communication systems because the wavelength variable range thereof is approximately 2 to 3 nm. Therefore, the multiple electrode DFB laser is not practical if the yield of devices and so forth are taken into consideration.

Further, with the technique disclosed in Japanese Patent Laid-Open No. Hei 7-273400, it is difficult to adjust the phase state of a region in which a diffraction grating is not formed only by formation of the device. Further, phase control is required, and the control is complicated.

It is an object of the present invention to provide a tunable laser which can be fabricated readily and can be provided with a comparatively wide wavelength variable range by simple control.

In order to attain the object described above, according to an aspect of the present invention, there is provided a tunable laser comprising an optical waveguide alternately including a gain waveguide portion capable of generating a gain and a wavelength controlling waveguide portion capable of controlling the oscillation wavelength by current injection or voltage application in the optical axis direction, and a diffraction grating provided along the optical waveguide over the entire length of the optical waveguide, the diffraction grating including a gain diffraction grating provided at a position corresponding to the gain waveguide portion and a wavelength controlling diffraction grating provided at a position corresponding to the wavelength controlling waveguide, a wavelength controlling region being configured such that the wavelength controlling waveguide portion and the wavelength controlling diffraction grating are included therein, a gain region being configured such that the gain waveguide portion and the gain diffraction grating are included therein, the Bragg wavelength of the wavelength controlling region being longer than that of the gain region in a state in which current injection or voltage application is not performed for the wavelength controlling waveguide portion.

According to another aspect of the present invention, there is provided a tunable laser comprising an optical waveguide alternately including a gain waveguide portion capable of generating a gain and a wavelength controlling waveguide portion capable of controlling the oscillation wavelength by current injection in the optical axis direction, and a diffraction grating provided along the optical waveguide over the entire length of the optical waveguide, the total length of the gain waveguide portion and wavelength controlling waveguide portion paired with each other to form the optical waveguide being set such that the continuous wavelength variable width can oscillate continuously in a resonance longitudinal mode is larger than the oscillation wavelength variable width where current is injected into the wavelength controlling waveguide portion.

According to a further aspect of the present invention, there is provided a tunable laser comprising an optical waveguide alternately including a gain waveguide portion capable of generating a gain and a wavelength controlling waveguide portion capable of controlling the oscillation wavelength by current injection in the optical axis direction, and a diffraction grating provided along the optical waveguide over the entire length of the optical waveguide, the wavelength controlling waveguide portion being formed from a semiconductor material, the ratio in length between the gain waveguide portion and the wavelength controlling waveguide portion paired with each other being 1:X, X being larger than 0, the total length of the gain waveguide portion and the wavelength controlling waveguide portion paired with each other being (140+30×X) µm or less.

According to a still further aspect of the present invention, there is provided an array integration type tunable laser comprising a plurality of tunable lasers provided on a common substrate and having wavelength variable ranges different from each other, wherein the tunable lasers are any one of the tunable lasers, respectively.

Accordingly, with the tunable lasers of the present invention, there is an advantage that they can be fabricated readily and a comparatively wide wavelength variable range can be obtained by simple control. Further, since the control is simple, wavelength control can be performed at a high speed.

Particularly, fabrication of an array integration type tunable laser is facilitated. Further, control upon changeover between the lasers is simplified, and wavelength control can be performed at a high speed.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

In the following, tunable lasers according to embodiments of the present invention are described with reference to FIG. 1 to FIG. 21 of the drawings.

First Embodiment

First, a tunable laser according to a first embodiment of the present invention is described with reference to FIGS. 1 to 10.

Figure 1:
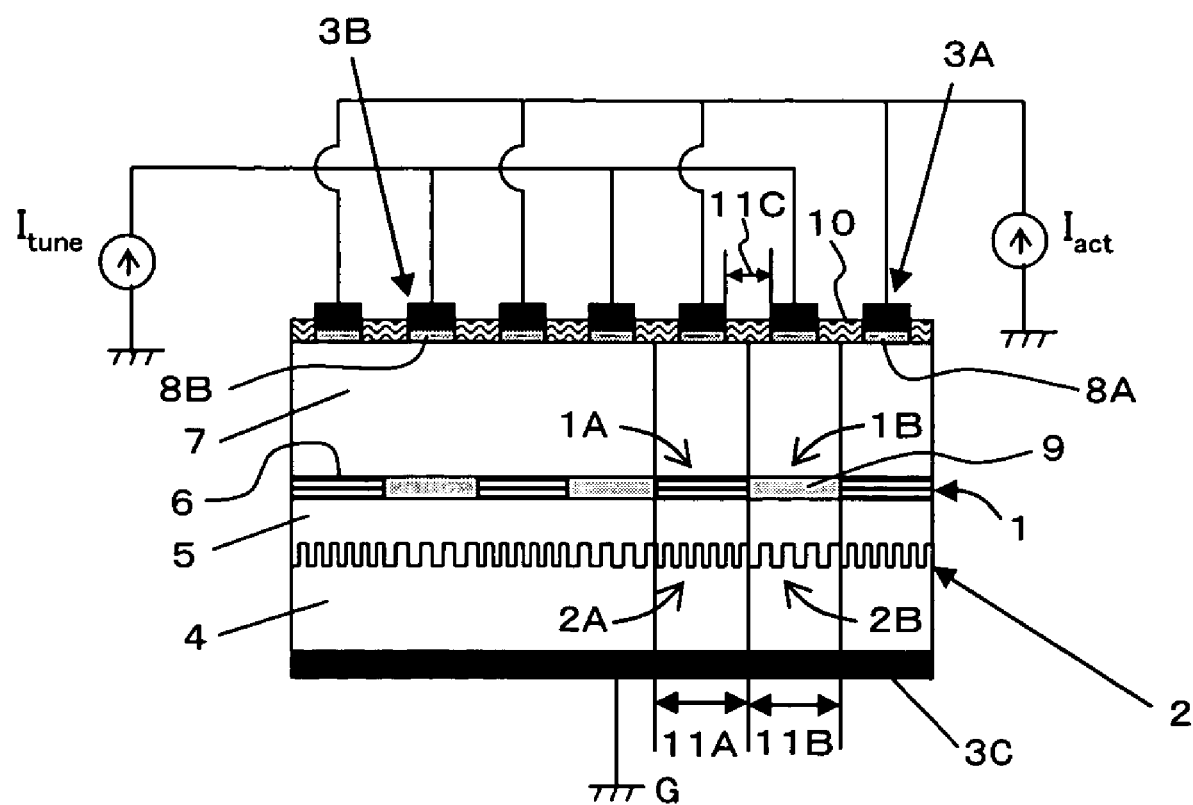
FIG. 1 is a schematic sectional view showing a configuration of a tunable laser according to a first embodiment of the present invention.

Referring to FIG. 1, a tunable laser (current control type tunable laser) according to the present embodiment includes an optical waveguide (optical waveguide layer) 1 having a gain waveguide section 1A capable of generating a gain by current injection therein and a wavelength controlling waveguide section 1B capable of controlling the oscillation wavelength by variation of the refractive index by current injection, and a diffraction grating (diffraction grating layer) 2 provided in the proximity of the optical waveguide 1. In the tunable laser according to the present embodiment, if current (gain controlling current) $I_{act}$ is injected into the gain waveguide section 1A, then laser oscillation occurs at a wavelength corresponding to the period of the diffraction grating 2 [TDA-DFB (Tunable Distributed Amplification-Distributed Feedback) laser]. Further, the oscillation wavelength can be controlled by injecting current (wavelength controlling current) $I_{tune}$ into the wavelength controlling waveguide section 1B.

As shown in FIG. 1, the optical waveguide 1 is configured such that it includes gain waveguide sections (active waveguide sections) 1A and wavelength controlling waveguide sections 1B disposed alternately in the direction of an optical axial thereof. In particular, the optical waveguide 1 includes a plurality of gain waveguide sections 1A and a plurality of wavelength controlling waveguide sections 1B, and the gain waveguide sections 1A and the wavelength controlling waveguide sections 1B are disposed periodically, alternately and serially on the same plane. It is to be noted that a particular example of a configuration of the gain waveguide sections 1A and the wavelength controlling waveguide sections 1B is hereinafter described.

As shown in FIG. 1, the diffraction grating 2 is provided in parallel along the optical waveguide 1 over the entire length of the optical waveguide 1. In particular, the diffraction grating 2 is continuously provided not only at positions corresponding to the gain waveguide sections 1A but also at positions corresponding to the wavelength controlling waveguide sections 1B. It is to be noted that, as shown in FIG. 1, a portion of the diffraction grating 2 formed at each of the positions corresponding to the gain waveguide sections 1A is called gain diffraction grating 2A, and a portion of the diffraction grating 2 formed at each of the positions corresponding to the wavelength controlling waveguide sections 1B is called wavelength controlling diffraction grating 2B.

In this manner, in the present tunable laser, different from a TTG-DFB laser, the gain waveguide sections 1A and the wavelength controlling waveguide sections 1B are arranged on the same plane as shown in FIG. 1. Therefore, a popular device fabrication technique can be used, and the device can be fabricated easily. For example, also in a case wherein tunable lasers are integrated to produce an array integration type tunable laser as in a seventh embodiment hereinafter described, the lasers can be integrated readily.

Further, the present tunable laser has a configuration similar to that of a common DFB laser and hence is a kind of a DFB laser. Therefore, similarly to a DBR laser, phase control need not be performed upon wavelength variable control, and simple wavelength control which uses only the wavelength controlling current $I_{tune}$ can be implemented. It is to be noted that, in the present tunable laser, since the diffraction grating 2 is provided over the entire length of the optical waveguide 1, also control of the initial phase need not be performed.

As shown in FIG. 1, in the present tunable laser, electrodes 3A and 3B are provided independently of each other in respective regions of the gain waveguide sections 1A and the wavelength controlling waveguide sections 1B so that current is injected into the gain waveguide sections 1A and the wavelength controlling waveguide sections 1B of the optical waveguide 1 independently of each other, respectively.

In particular, as shown in FIG. 1, the gain electrodes (P side electrodes) 3A are formed on the upper face of the gain waveguide sections 1A of the optical waveguide 1 with a contact layer 8A interposed therebetween while a common electrode (N side electrode) 3C is formed below the gain waveguide sections 1A so that the current $I_{act}$ can be injected into an active layer (gain layer, waveguide core layer) 6 of the gain waveguide sections 1A. Further, wavelength controlling electrodes (P side electrodes) 3B are formed on the upper face of the wavelength controlling waveguide sections 1B of the optical waveguide 1 with a contact layer 8B interposed therebetween and the common electrode (N side electrode) 3C is formed below the wavelength controlling waveguide sections 1B so that the current $I_{tune}$ can be injected into wavelength controlling layer (waveguide core layer, phase controlling layer) 9 of the wavelength controlling waveguide sections 1B.

Figure 2:
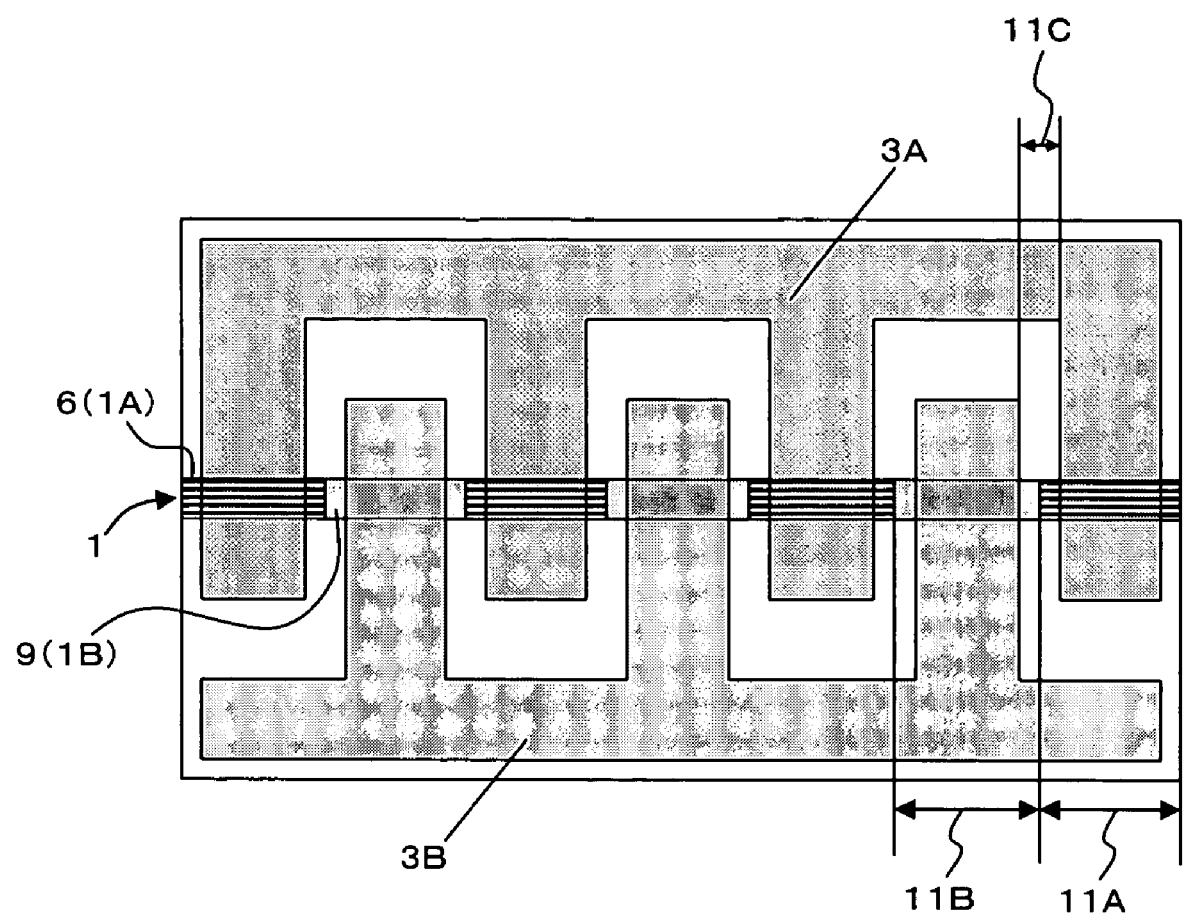
FIG. 2 is a schematic plan view illustrating a configuration of an electrode of the tunable laser according to the first embodiment of the present invention.

Here, the gain electrodes 3A and the wavelength controlling electrodes 3B are each configured as a comb-like electrode as shown in FIG. 2.

It is to be noted that a region configured from a gain waveguide section 1A, the gain diffraction grating 2A, a gain electrode 3A and the common electrode 3C is hereinafter referred to as gain region 11A, and a region configured from a wavelength controlling waveguide section 1B, the wavelength controlling grating 2B, a wavelength controlling electrode 3B and the common electrode 3C is hereinafter referred to as wavelength controlling region 11B.

Further, as shown in FIG. 1, a $SiO_2$ film (passivation film) 10 is formed in regions in which the contact layers 8A and 8B, wavelength controlling electrodes (P side electrodes) 3B and gain electrodes (P side electrodes) 3A are not formed. The $SiO_2$ film 10 is formed in the following manner. In particular, after the contact layers 8A and 8B are formed, the $SiO_2$ film 10 is formed on the entire face, and only the $SiO_2$ film 10 on the contact layers 8A and 8B is removed. Thereafter, the P side electrodes 3A and 3B are formed on the contact layers 8A and 8B, respectively. Consequently, the $SiO_2$ film 10 remains formed in the regions in which the contact layers 8A and 8B and the P side electrodes 3A and 3B are not formed.

Particularly, as shown in FIGS. 1 and 2, in order to electrically isolate the gain regions 11A and the wavelength controlling regions 11B from each other, an isolating region (isolating section) 11C is formed between each adjacent ones of the gain electrodes 3A and the wavelength controlling electrodes 3B. In particular, the wavelength controlling electrodes (P side electrodes) 3B, gain electrodes (P side electrodes) 3A and contact layers 8A and 8B are not formed in regions above and in the proximity of joining interfaces between the gain regions 11A and the wavelength controlling regions 11B thereby to form the isolating sections 11C.

It is to be noted that, while the oscillation wavelength here is controlled by current injection into the wavelength controlling waveguide sections 1B, the controlling method of the oscillation wavelength is not limited to this. For example, the oscillation wavelength may be controlled by applying a voltage to the wavelength controlling waveguide sections 1B through the wavelength controlling electrodes 3B.

Incidentally, in the present tunable laser, the Bragg wavelength of each of the gain regions 11A is fixed while the refractive index of the core layer of the wavelength controlling waveguide section 1B in each of the wavelength controlling regions 11B is varied to vary the Bragg wavelength of the wavelength controlling region 11B thereby to perform wavelength variable operation.

For example, where the ratio between the length of the gain waveguide section 1A and the length of the wavelength controlling waveguide 1B is set to 1:1, the oscillation wavelength of the present tunable laser has an average value of the Bragg wavelength of the gain region 11A and the Bragg wavelength of the wavelength controlling region 11B.

Therefore, where the Bragg wavelength of the gain region 11A is represented by $\lambda_a$, the Bragg wavelength of the wavelength controlling region 11B by $\lambda_t$, the Bragg wavelength of the wavelength controlling region 11B before the refractive index thereof is varied (before current injection) by $\lambda_{r0}$, the variation amount of the equivalent refractive index of the wavelength controlling waveguide section 1B by $\Delta n_r$, and the equivalent refractive index of the wavelength controlling waveguide section 1B before the refractive index thereof is varied (before current injection) by $n_r$, the Bragg wavelength (oscillation wavelength) $\lambda_{Bragg}$ of the present tunable laser when the refractive index of the core layer of the wavelength controlling waveguide 1B is varied can be represented by the following expression (1):

$$\lambda_{Bragg}=(\lambda_a+\lambda_r)/2=\{\lambda_a+\lambda_{r0}(1+\Delta n_r/n_r)\}/2 \quad (1)$$

Accordingly, the variation amount $\Delta\lambda_{Bragg}$ of the Bragg wavelength (oscillation wavelength) of the present tunable laser can be given by the following expression (2):

$$\Delta\lambda_{Bragg}=\lambda_{r0}\cdot(\Delta n_r/n_r)/2 \quad (2)$$

On the other hand, the rate of variation of the resonance longitudinal mode wavelength (position of the resonance longitudinal mode) is lower than that of the equivalent refractive index of the wavelength controlling waveguide sections 1B by an amount corresponding to the proportion (here, ½) of the length of all of the wavelength controlling waveguide sections 1B (total length of the plural wavelength controlling waveguide sections 1B) with respect to the entire length of the resonator.

Therefore, the variation amount $\Delta\lambda_1$ of the resonance longitudinal mode wavelength can be given, where the resonance longitudinal mode wavelength (oscillation wavelength) before the refractive index is varied (before current injection) is $\lambda_0$, by the following expression (3)

$$\Delta\lambda_1=\lambda_0\cdot(\Delta n_r/n_r)/2 \quad (3)$$

Accordingly, it can be recognized from the expressions (2) and (3) above that, if $\lambda_{r0}$ and $\lambda_0$ are set so as to be substantially equal to each other, then the variation amount $\Delta_{Bragg}$ of the Bragg wavelength and the variation amount $\Delta\lambda_1$ of the resonance longitudinal mode wavelength coincide with each other. Therefore, if $\lambda_{r0}$ and $\lambda_0$ are set so as to be substantially equal to each other, then only if the refractive index of the wavelength controlling waveguide section 1B is varied (that is, only if wavelength variable control is performed without performing phase control), the oscillation wavelength can be varied continuously while appearance of mode hopping is prevented. It is to be noted that, while normally $\lambda_{r0}$ and $\lambda_0$ substantially coincide with each other, where it is desired to make $\lambda_{r0}$ and $\lambda_0$ fully coincide with each other, a $\lambda/4$ phase shifting portion 2C (refer to FIG. 5) should be provided.

Incidentally, in the present tunable laser, if the difference between the Bragg wavelength of the wavelength controlling region 11B and the Bragg wavelength of the gain region 11A becomes excessively great upon wavelength variable control, then mode hopping appears and continuous wavelength variable operation cannot be performed.

In particular, current is injected into the gain waveguide sections 1A first. Then, where, in a state in which current is not injected into the wavelength controlling waveguide section 1B, a peak (central wavelength; Bragg wavelength) of the reflection spectrum by the diffraction grating 2 in the wavelength controlling region 11B coincides with a peak (central wavelength; Bragg wavelength) of the reflection spectrum by the diffraction grating 2 in the gain region 11A as indicated by reference character A in FIG. 3(A), the total reflection spectrum which is the sum of the reflection spectrum by the diffraction grating 2 in the wavelength controlling region 11B and the reflection spectrum by the diffraction grating 2 in the gain region 11A is such as indicated by reference character A' in FIG. 3(B). Then, the central wavelength (peak; Bragg wavelength) of the resulting reflection spectrum becomes the oscillation wavelength of the present tunable laser.

Figure 3A:
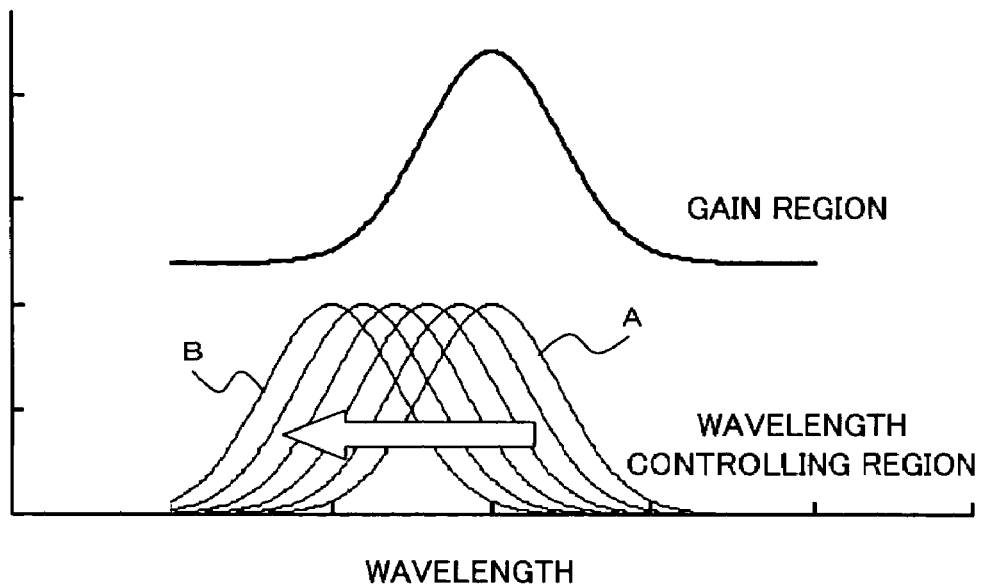
FIGS. 3(A) and 3(B) are diagrams illustrating different manners of variation of the oscillation wavelength of the tunable laser according to the first embodiment of the present invention.
Figure 3B:
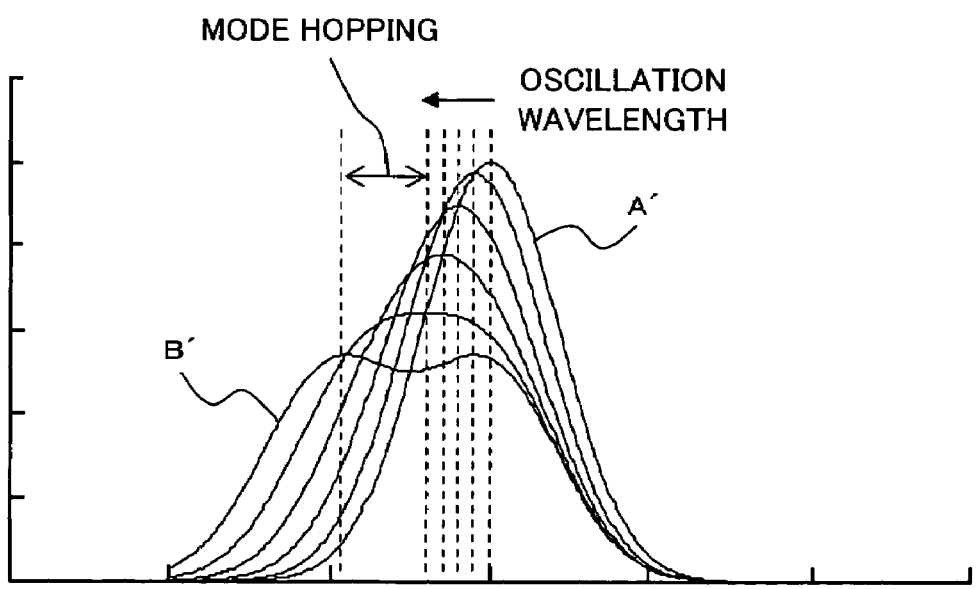

If current is injected into the wavelength controlling waveguide sections 1B in the state described above, then the Bragg wavelength of the wavelength controlling region 11B is shifted to the short wavelength side as shown in FIG. 3(A). Then, if the difference between the Bragg wavelength of the wavelength controlling region 11B and the Bragg wavelength of the gain region 11A becomes great as indicated by reference character B in FIG. 3(A), then, in the total reflection spectrum, the width of the reflection spectrum so expands that two peaks appear as indicated by reference character B' in FIG. 3(B).

If the reflection spectrums of the diffraction grating 2 in the individual regions are separated from each other in this manner, then oscillation at the central wavelength cannot be maintained, and mode hopping appears and continuous wavelength variable operation cannot be performed.

On the other hand, it can be recognized that, where the Bragg wavelength of the wavelength controlling region 11B is displaced to the short wavelength side with respect to the Bragg wavelength of the gain region 11A, there exists a continuous wavelength variable region wherein single mode oscillation can be performed continuously without suffering from appearance of mode hopping.

However, also in a case wherein the Bragg wavelength of the wavelength controlling region 11B is displaced to the long wavelength side with respect to the Bragg wavelength of the gain region 11A, similarly as in the case described above, there exists a continuous wavelength variable region wherein single mode oscillation can be performed continuously without suffering from appearance of mode hopping.

Therefore, if the wavelength variable operation is performed so that the Bragg wavelength of the wavelength controlling region 11B and the Bragg wavelength of the gain region 11A are made coincide with each other in a state in which current injection into or voltage application to the wavelength controlling waveguide sections 11B is not performed, then this results in the fact that only one half the entire continuous wavelength variable region of the present tunable laser is utilized.

Therefore, the tunable laser in the present embodiment is configured such that the Bragg wavelength $\lambda_r$ of the wavelength controlling region 11B is positioned on the long wavelength side with respect to the Bragg wavelength $\lambda_a$ of the gain region 11A in a state in which current injection into or voltage application to the wavelength controlling waveguide sections 1B is not performed.

Here, where the total length (length of one period) of a gain waveguide section 1A and a wavelength controlling waveguide section 1B neighboring and paired with each other is represented by L (μm) and the difference between the Bragg wavelength $\lambda_r$ (nm) of the wavelength controlling region 11B and the Bragg wavelength $\lambda_a$ (nm) of the gain region 11A by $\Delta\lambda$ ($=\lambda_r-\lambda_a$) (nm), the variable wavelength laser of the present embodiment is configured so as to satisfy, in a state in which current injection into or voltage application to the wavelength controlling waveguide sections 11B is not performed, the following expression (4):

$$0<\Delta\lambda/\lambda_a\leq 30/L(\%) \quad (4)$$

In particular, the gain region 1A and the wavelength controlling region 11B are configured such that the ratio (hereinafter referred to as proportion of the Bragg wavelength difference) $\Delta\lambda/\lambda_a$ ($\Delta\lambda/\lambda_{rf}$) of the difference $\Delta\lambda$ between the Bragg wavelength $\lambda_t$ of the wavelength controlling region 11B and the Bragg wavelength $\lambda_a$ of the gain region 11A to the Bragg wavelength $\lambda_a$ (reference wavelength $\lambda_{rf}$) of the gain region 11A is higher than 0 but equal to or lower than 30/L (%).

It is to be noted that, while the Bragg wavelength $\lambda_a$ of the gain region 11A is defined as the reference wavelength $\lambda_{rf}$ here, the reference wavelength is not limited to this. For example, the Bragg wavelength $\lambda_t$ of the wavelength controlling region 11B may be used as the reference wavelength $\lambda_{rf}$.

By intentionally displacing the Bragg wavelength $\lambda_t$ of the wavelength controlling region 11B to the long wavelength side with respect to the Bragg wavelength $\lambda_a$ of the gain region 11A in this manner, the continuous wavelength variable region of the present tunable laser can be used effectively. Further, in this instance, by configuring the gain region 11A and the wavelength controlling region 11B so as to satisfy the expression (4), appearance of mode hopping can be prevented and the continuous wavelength variable region in the present tunable laser can be used effectively while stabilized single mode oscillation is maintained. Detailed description is given below.

Figure 4:
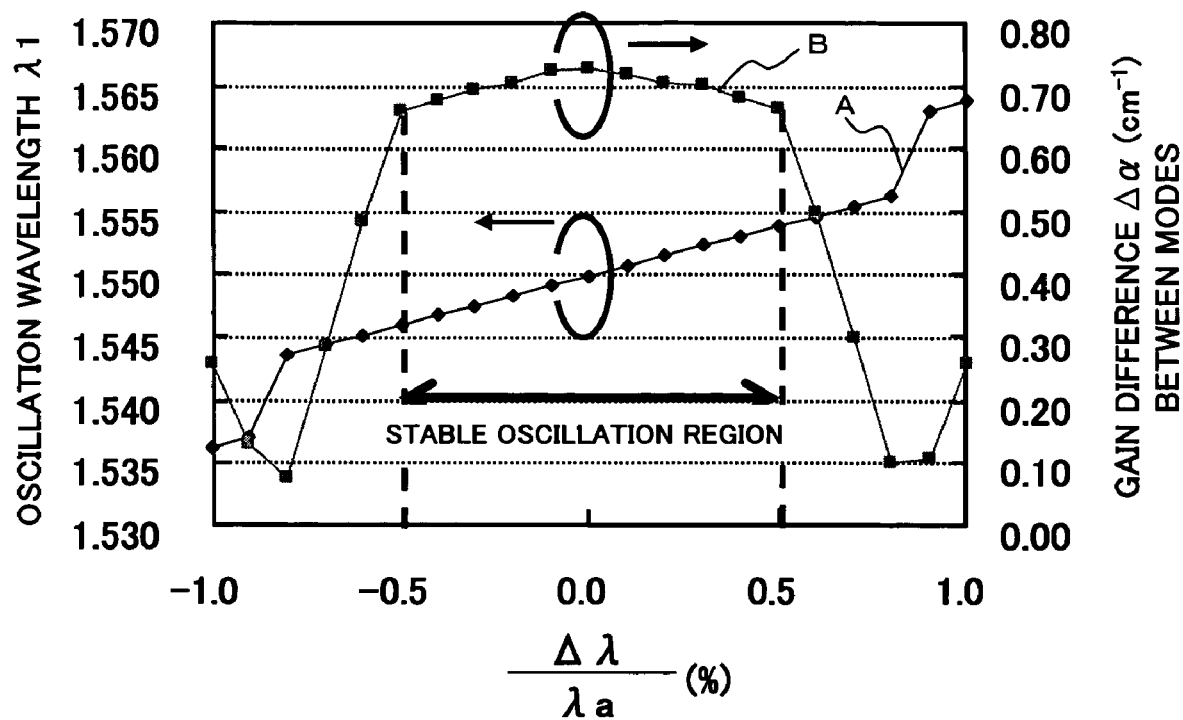
FIG. 4 is a diagram illustrating a relationship between the proportion of a Bragg wavelength difference and the oscillation wavelength and gain difference between modes of the tunable laser according to the first embodiment of the present invention.

FIG. 4 is a diagram illustrating a relationship between the proportion $\Delta\lambda/\lambda_a$ of the Bragg wavelength difference and the oscillation wavelength characteristic and gain difference between modes where the length of one period formed from a gain waveguide section 1A and a wavelength controlling waveguide section 1B (1:1 in length) paired with each other is 60 μm.

It is to be noted that, in FIG. 4, oscillation wavelength λ1 is indicated by a solid line A, and the gain difference Δα between modes is indicated by another solid line B. Further, where the value of the proportion $\Delta\lambda/\lambda_a$ of the Bragg wavelength difference $\Delta\lambda$ is a positive value, this signifies that the Bragg wavelength $\lambda_t$ of the wavelength controlling region 11B is displaced to the long wavelength side with respect to the Bragg wavelength $\lambda_a$ of the gain region 11A. On the contrary, where the value of the proportion $\Delta\lambda/\lambda_a$ of the Bragg wavelength difference is a negative value, this signifies that the Bragg wavelength $\lambda_1$ of the wavelength controlling region 11B is displaced to the short wavelength side with respect to the Bragg wavelength $\lambda_a$ of the gain region 11A.

It has been found that, according to the present tunable laser, the oscillation wavelength characteristic with respect to the proportion $\Delta\lambda/\lambda_a$ of the Bragg wavelength difference is such that, as indicated by a solid line A in FIG. 4, it is linear within a predetermined range and, where the absolute value of the proportion $\Delta\lambda/\lambda_a$ of the Bragg wavelength difference increases exceeding the range (continuous wavelength variable region), the n mode hopping appears and laser oscillation becomes unstable. In particular, it has been found that, in the present tunable laser, when the Bragg wavelength $\lambda_t$ of the wavelength controlling region 11B is varied from a position displaced to the long wavelength side with respect to the Bragg wavelength $\lambda_a$ of the gain region 11A to a position displaced to the short wavelength side with respect to the Bragg wavelength $\lambda_a$ of the gain region 11A, the oscillation wavelength λ1 continuously varies to the short wavelength side within a predetermined range as indicated by the solid line A in FIG. 4.

Therefore, if the Bragg wavelength $\lambda_t$ of the wavelength controlling region 11B is displaced to the long wavelength side with respect to the Bragg wavelength $\lambda_a$ of the gain region 11A within a predetermined range within which the oscillation wavelength characteristic remains linear in a state in which current injection into or voltage application to the wavelength controlling waveguide section 1B is not performed and then current injection into or voltage application to the wavelength controlling waveguide section 1B is performed to decrease the equivalent refractive index of the wavelength controlling waveguide section 1B thereby to displace the Bragg wavelength $\lambda_t$ of the wavelength controlling region 11B to the short wavelength side, then the continuous wavelength variable range can be used effectively. It is to be noted that the Bragg wavelength $\lambda_t$ of the wavelength controlling region 11B can be displaced to the short wavelength side within a range up to approximately 1.0% by current injection.

Further, it has been found that, according to the present tunable laser, since, as the absolute value of the proportion $\Delta\lambda/\lambda_a$ of the Bragg wavelength difference increases, then the gain difference between the modes decreases as indicated by a solid line B in FIG. 4, and consequently, there is the possibility that mode hopping may occur, and this makes laser oscillation unstable.

Therefore, in order to perform wavelength variable operation while stabilized single mode oscillation is maintained, it is necessary to set the proportion $\Delta\lambda/\lambda_a$ of the Bragg wavelength difference within a predetermined range [where the length of one period is 60 μm, for example, within ±0.5% ($-0.5<\Delta\lambda/\lambda_a<+0.5$); stable oscillation region].

Accordingly, where the length of one period is set to 60 μm, if the Bragg wavelength $\lambda_t$ of the wavelength controlling region 11B in a state in which current injection into or voltage application to the wavelength controlling waveguide section 1B is not performed is displaced within a range of 0.5% ($0<\Delta\lambda/\lambda_a<+0.5$) to the long wavelength side with respect to the Bragg wavelength $\lambda_a$ of the gain region 1A, then the continuous wavelength variable region can be used effectively while stabilized single mode oscillation is maintained.

On the other hand, it has been found as a result of investigations by the inventor of the present invention that the continuous wavelength variable region increases in substantially reverse proportion to the length of one period.

If this is generalized, in order to perform wavelength variable operation while stabilized single mode oscillation is maintained, where the length of one period is represented by L (μm), the proportion $\Delta\lambda/\lambda_a$ of the Bragg wavelength difference should be set to a value within ±30/L (%)($-30/L<\Delta\lambda/\lambda_a\leq+30/L$).

Then, if the Bragg wavelength t of the wavelength controlling region 11B is displaced to the long wavelength side with respect to the Bragg wavelength $\lambda_a$ of the gain region 11A within a range within which the proportion $\Delta\lambda/\lambda_a$ of the Bragg wavelength difference is 30/L(%) ($0<\Delta\lambda/\lambda_a\leq+30/L$) in a state in which current injection into or voltage application to the wavelength controlling waveguide section 1B is not performed, then the continuous wavelength variable region can be used effectively while stabilized single mode oscillation is maintained.

Incidentally, adjustment of the Bragg wavelength of the wavelength controlling region 11B and the Bragg wavelength of the gain region 11A can be performed by adjusting the period of the diffraction grating 2 in each of the regions or the equivalent refractive index of the waveguide section in each of the regions. Further, the adjustment of the equivalent refractive index can be performed by adjusting the composition, thickness or width of the core layer of the waveguide section in each of the regions.

In the present embodiment, the gain diffraction gratings 2A and the wavelength controlling diffraction gratings 2B are configured such that the periods thereof are different from each other as seen in FIG. 1.

More particularly, the period of the wavelength controlling diffraction gratings 2B is set longer than that of the gain diffraction gratings 2A. In particular, the period of the wavelength controlling diffraction gratings 2B is longer than the period of the gain diffraction gratings 2A within a range within which the proportion $\Delta\lambda/\lambda_a$ of the Bragg wavelength difference is 30/L (%)(0 <$\Delta\lambda/\lambda_a$≦+30/L).

Consequently, the Bragg wavelength $\lambda_t$ of the wavelength controlling region 11B can be displaced to the long wavelength side with respect to the Bragg wavelength $\lambda_a$ of the gain region 11A within a range within which the proportion $\Delta\lambda/\lambda_a$ of the Bragg wavelength difference is 30/L (%)(0<$\Delta\lambda/\lambda_a$≦+30/L) in a state in which current injection into or voltage application to the wavelength controlling waveguide section 1B is not performed. Consequently, the continuous wavelength variable region can be used effectively while stabilized single mode oscillation is maintained.

In the following, particular examples of the configuration are described.

First, the gain region (active region) 11A has a laminated structure wherein, for example, an n-type InP buffer layer, an n-type InGaAsP diffraction grating layer, an n-type InP buffer layer, a 1.55 μm band distortion MQW (Multiple Quantum Well) layer+SCH (Separate Confinement Heterostructure) layer designed so as to have a band gap wavelength in the 1.55 μm band, a p-type InP cladding layer, a p-type InGaAsP contact layer and a p-type InGaAs contact layer are laminated in order on an n-type InP substrate (semiconductor substrate).

In particular, as shown in FIG. 1, the gain region 11A has a laminated (stacked) structure in which an n-InP layer (n-type InP substrate, n-type InP buffer layer) 4, an n-type InGaAsP diffraction grating layer 2, an n-type InP layer 5, an MQW active layer (1.55 μm band distortion MQW layer+ SCH layer) 6, a p-InP layer (p-type InP cladding layer) 7, and a contact layer (p-type InGaAsP contact layer, p-type InGaAs contact layer) 8A are laminated in order.

Meanwhile, the gain waveguide section (active waveguide section) 1A is formed from the n-type Inp Layer 5, MQW active layer (waveguide core layer) 6 and p-InP layer 7.

Here, the 1.55 μm band distortion MQW layer which forms the MQW active layer 6 is configured such that, for example, the well layer is formed as an InGaAsP layer of 5.1 nm thick having a compression distortion of 0.8% and the barrier layer is formed as a distortion-free InGaAsP layer of 10 nm thick designed so as to have a band gap wavelength of 1.30 μm, and the number of well layers is set to 6. It is to be noted that the composition of the InGaAsP layer as a well layer is adjusted so that the light emission wavelength of the MQW layer is within the 1.55 μm band.

As the SCH layer which forms the MQW active layer 6, an InGaAsP layer of 50 nm thick designed so as to have a band gap of 1.15 μm is used above and below a distortion MQW layer.

Further, the thickness of the MQW active layer 6 including the distortion MQW layer and the SCH layer is approximately 200 nm. The width of the MQW active layer 6 is 1.6 μm.

Meanwhile, the wavelength controlling region 11B has a laminated structure wherein, for example, an n-type InP buffer layer, an n-type InGaAsP diffraction grating layer, an n-type InP buffer layer, a 1.30 μm composition InGaAsP layer (wavelength core layer), a p-type InP cladding layer, ap-type InGaAsP contact layer and ap-type InGaAs contact layer are laminated in order on an n-type InP substrate.

In particular, the wavelength controlling region 11B has a laminated structure in which, as shown in FIG. 1, the n-InP layer (n-type InP substrate, n-type InP buffer layer) 4, the n-type InGaAsP diffraction grating layer 2, the n-type InP layer 5, a wavelength controlling layer (phase controlling layer) 9, the p-InP layer (p-type InP cladding layer) 7 and a contact layer (p-type InGaAs contact layer, p-type InGaAs contact layer) 8 are laminated in order.

The wavelength controlling waveguide section 1B is formed from the n-type InP layer 5, wavelength controlling layer (waveguide core layer) 9 and p-InP layer 7.

Here, for the wavelength controlling layer 9, an InGaAsP layer (1.30 μm composition InGaAsP layer) of 200 nm thick designed so as to have a band gap of 1.30 μm is used. The width of the wavelength controlling layer 9 is 1.6 μm.

Where the waveguide is designed in such a manner as described above, the equivalent refractive indices of the gain waveguide section 1A and the wavelength controlling waveguide section 1B substantially coincide with each other.

It is to be noted that the diffraction grating 2 is formed by first laminating a layer made of a material used to form the diffraction grating layer 2 on the n-InP layer 4, removing the layer periodically using such a method as, for example, dry etching and then growing the n-type InP layer 5 on the layer.

Further, as a current blocking structure for the MQW active layer 6 and the wavelength controlling layer 9, for example, a pn-BH structure (Buried Heterostructure) may be used.

Particularly, the lengths of the gain waveguide section 1A and the wavelength controlling waveguide section 1B are both set to 30 μm, and the length of one period of them is set to 60 μm. It is to be noted that the device length is, for example, 570 μm. Here, the gain waveguide section 1A is disposed on the device end face side so that the light output may not drop. However, conversely the wavelength controlling waveguide section 1B may be disposed on the device end face side.

The period of the diffraction grating 2 is set such that, for example, the period of the gain diffraction grating 2A is 240 nm and that of the wavelength controlling diffraction grating 2B is 241.2 nm (100.5% of that of the gain diffraction grating).

In this manner, in the present embodiment, the gain waveguide section 1A and the wavelength controlling waveguide section 1B have equivalent refractive indices equal to each other while the period of the gain diffraction grating 2A and the period of the wavelength controlling diffraction grating 2B are different from each other. In particular, the period of the wavelength controlling diffraction grating 2B is set longer than that of the gain diffraction grating 2A.

By the setting described, the Bragg wavelength $\lambda_t$ of the wavelength controlling region 11B can be displaced by 0.5% (since the length of one period here is 60 μm) to the long wavelength side with respect to the Bragg wavelength $\lambda_a$ of the wavelength controlling region 11B in a state in which current injection into or voltage application to the wavelength controlling waveguide section 1B is not performed. Consequently, the continuous wavelength variable region can be used effectively while stabilized single mode oscillation is maintained.

Figure 5:
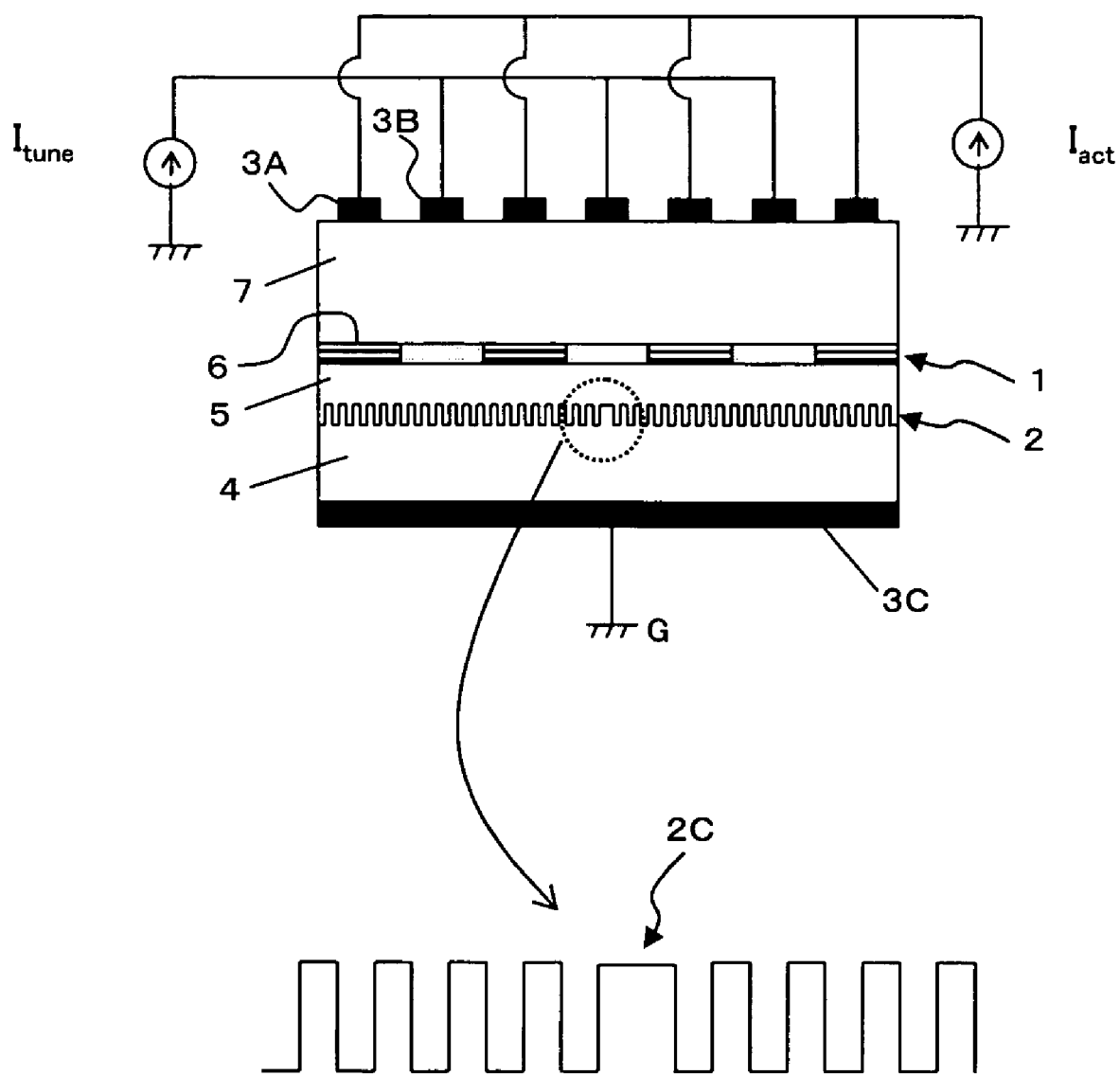
FIG. 5 is a schematic view showing a configuration of the tunable laser according to the first embodiment of the present invention where a λ/4 phase shifting portion is provided.

It is to be noted that preferably the diffraction grating 2 is configured such that it has a λ/4 phase shifting portion 2C at a central position thereof in the longitudinal direction as seen in FIG. 5. In other words, preferably the diffraction grating 2 is configured such that the phase of light (the period of the diffraction grating 2) is shifted (phase shift) by one half the period of the diffraction grating 2 (¼ the Bragg wavelength) at a central position of the diffraction grating 2 in the longitudinal direction as seen in FIG. 5.

Figure 6A:
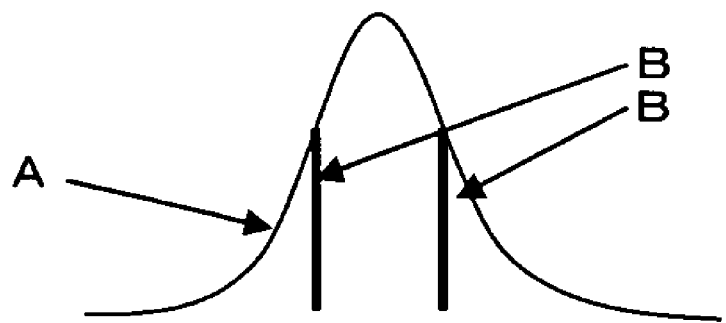
FIGS. 6(A) and 6(B) are diagrams illustrating a reason why it is preferable to provide the λ/4 phase shifting portion in the tunable laser according to the first embodiment of the present invention.
Figure 6B:
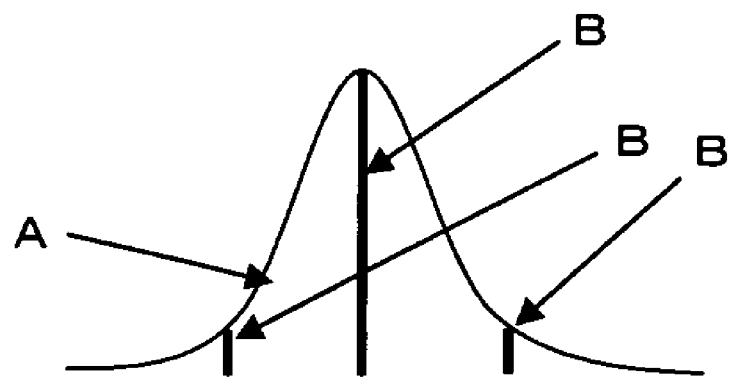

If the λ/4 phase shifting portion 2C is not provided, the n oscillation do not occur at a central wavelength (peak; Bragg wavelength) of the reflection spectrum by the diffraction grating 2 [gain spectrum of the tunable laser; indicated by a solid line A in FIG. 6(A)] as seen in FIG. 6(A), but there is the possibility that oscillation may be generated in two modes in the proximity of the central wavelength [resonance longitudinal mode wavelengths; indicated by solid lines B in FIG. 6(A)]. In this instance, since it cannot be known whether oscillation occurs in the long wavelength side mode or in the short wavelength side mode, the operation becomes unstable.

On the other hand, where the λ/4 phase shifting portion 2C is provided, since the central wavelength (peak; Bragg wavelength) of the reflection spectrum [gain spectrum of the tunable laser; indicated by a solid line A in FIG. 6(B)] by the diffraction grating 2 and one of the resonance longitudinal mode wavelengths [indicated by solid lines B in FIG. 6(B)] coincide with each other as seen from FIG. 6(B) similarly to an ordinary DFB laser and oscillation occurs at the central wavelength, stabilized single mode oscillation can be obtained.

However, even if the λ/4 phase shifting portion 2C is not provided, oscillation occurs usually in one of the two modes.

Accordingly, with the tunable laser according to the present embodiment, there is an advantage that it can be produced readily and a comparatively wide wavelength variable range can be obtained by simple control. Further, since the control is simple, wavelength control can be performed at a high speed. Particularly since the tunable laser is a current control type wavelength variable laser, it is superior in high speed responsibility.

Incidentally, where the period of the gain diffraction grating 2A and the period of the wavelength controlling diffraction grating 2B are set different from each other (that is, where diffraction gratings all having an equal period are not provided but diffraction gratings having different periods from one another within one device are provided) as in the case of the present embodiment, the phases of reflected light by the diffraction gratings do not sometimes coincide with each other. In this instance, depending upon the condition of the phases of the reflected light, the oscillation becomes very unstable. As a result, the tunable laser cannot sometimes be used as a light source for optical communication.

Figure 7:
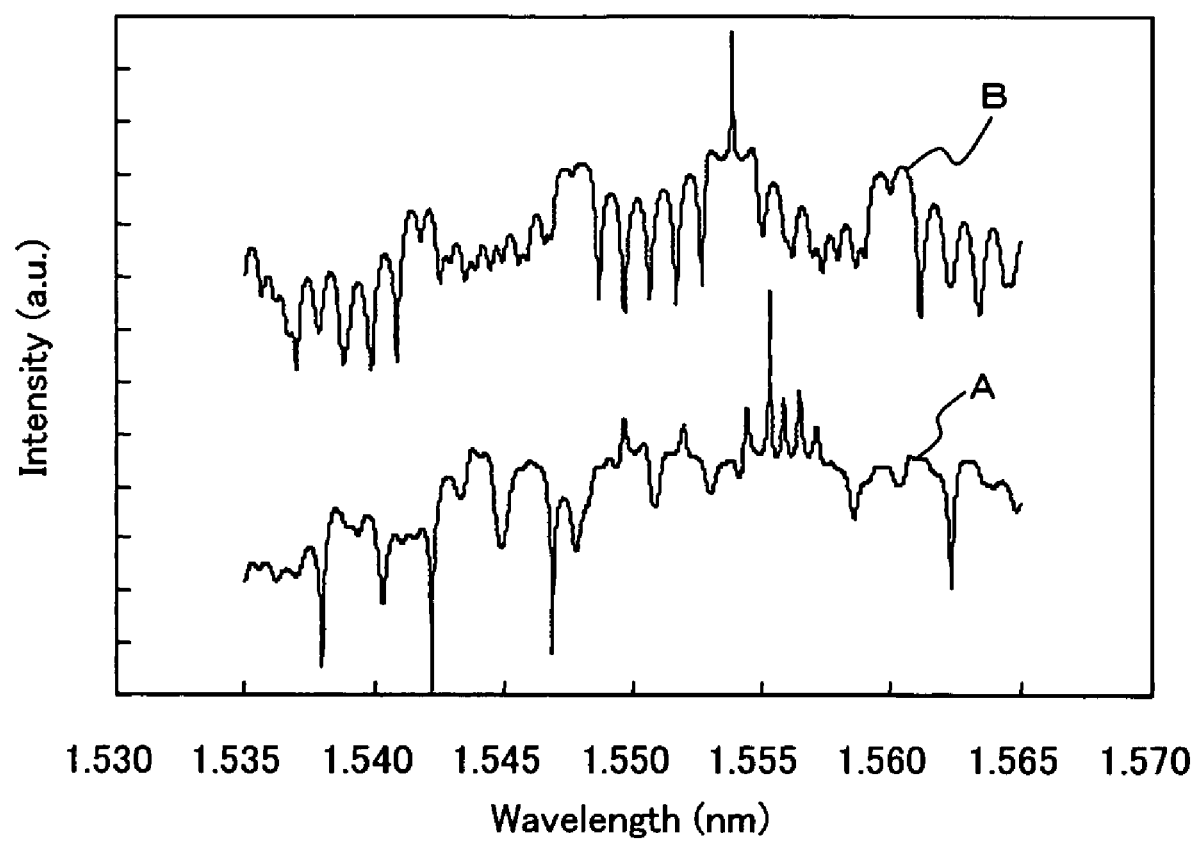
FIG. 7 is a diagram illustrating calculation results of the oscillation spectrum in a case wherein the phases of reflected light from diffraction gratings having periods different from each other coincide with each other and another case wherein the phases do not coincide with each other in the tunable laser according to the first embodiment of the present invention.

Referring to FIG. 7, a solid line A indicates a result of calculation of the oscillation spectrum where the phases of reflected light by diffraction gratings having different periods from each other do not coincide with each other.

As indicated by the solid line A in FIG. 7, where the phases of reflected light from the diffraction gratings do not coincide with each other, a plurality of peaks appear on the oscillation spectrum, and it can be recognized that the oscillation is very unstable.

Figure 9:
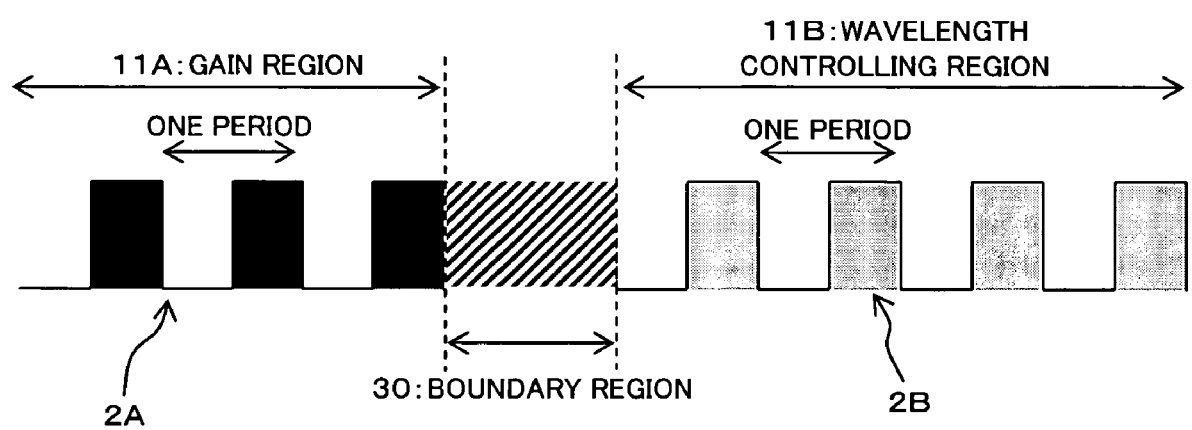
FIG. 9 is a schematic view showing an example of a configuration where a boundary region is provided in the tunable laser according to the first embodiment of the present invention.

Further, where the phases of reflected light from the diffraction gratings do not coincide with each other, the actual oscillation wavelength of the TDA-DFB laser is displaced from a designed value of the oscillation wavelength in principle and also the accuracy of the oscillation wavelength is deteriorated.

Where such points as described above are taken into consideration, diffraction gratings having different periods from each other are preferably provided in a spaced relationship by a predetermined distance from each other without providing them in a contiguous relationship to each other such that the phases of reflected light from such diffraction gratings having different periods from each other coincide with each other. In particular, the gain diffraction grating 2A and the wavelength controlling diffraction grating 2B are provided in a condition wherein the wavelength controlling diffraction grating 2B is shifted (phase shift) by a predetermined distance from the gain diffraction grating 2A such that a boundary region 30 (or 30A) may be configured between adjacent ones of the gain diffraction grating 2A and the wavelength controlling diffraction grating 2B, for example, as seen in FIG. 9 (or FIG. 10).

In FIG. 7, a solid line B indicates a result of calculation of an oscillation spectrum where the phases of reflected light from diffraction gratings having different periods from each other coincide with each other (here, a phase shift is provided between the diffraction gratings having different periods from each other).

As indicated by the solid line B in FIG. 7, where the phases of reflected light from the diffraction gratings coincide with each other, the oscillation spectrum has a single main peak, and it can be recognized that stabilized single mode oscillation is achieved.

Figure 8:
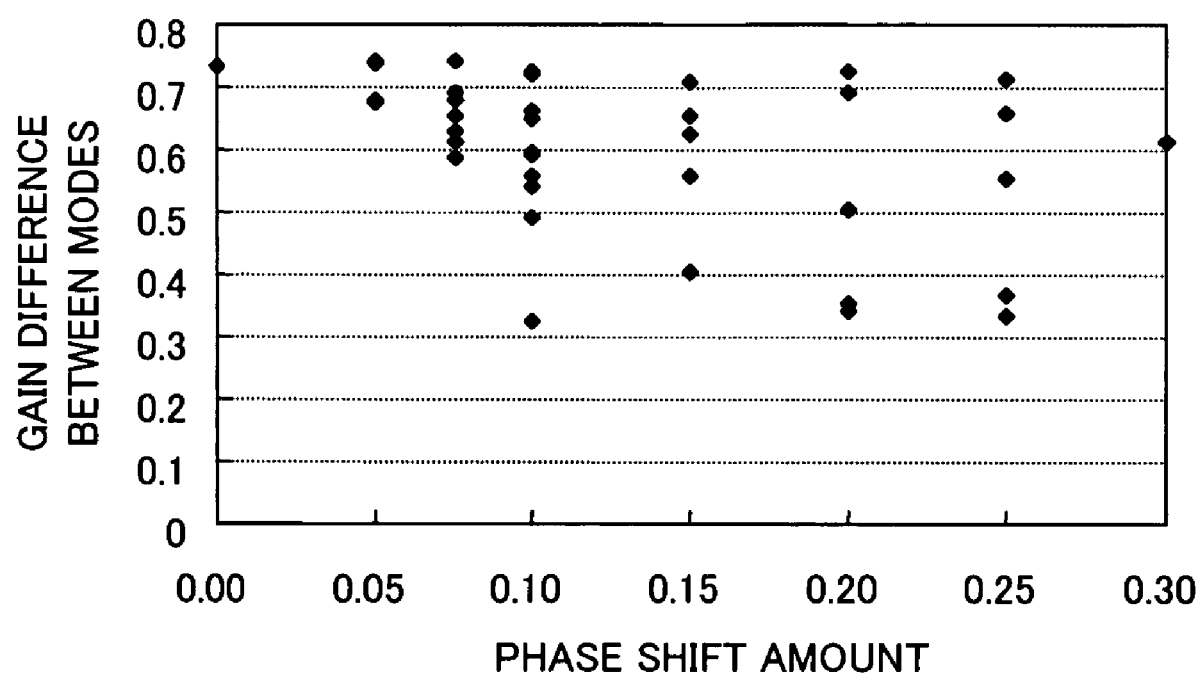
FIG. 8 is a diagram illustrating a relationship between the phase shift amount and the gain difference between modes in the tunable laser according to the first embodiment of the present invention.

FIG. 8 illustrates a relationship (calculation result) between the phase shift amount between diffraction gratings having different periods from each other (length of the boundary region; magnitude of the distance between the diffraction gratings having different periods from each other) and the gain difference between modes indicative of the stability of the single mode oscillation.

It is to be noted that, in FIG. 8, the axis of abscissa indicates the phase shift amount, and the calculation was conducted under the condition that, determining that the phase shift amount where one of the diffraction gratings is phase-shifted by one period with respect to the other diffraction grating (that is, where diffraction gratings having different periods from each other have phases displaced by n from each other) is 1.00, the phase shift amount indicated by the axis of abscissa is determined as a maximum value and a phase shift is included at random in each boundary region.

Where the phase shift amount is larger than 0.10 (0.10π) as seen from FIG. 8, it can be recognized that, depending upon the condition of the phases of individual reflected light, the gain difference between modes decreases remarkably to approximately 0.3.

From this fact, in order to obtain stabilized single mode oscillation, it is necessary to set the phase shift amount in each boundary region to a value equal to or lower than 0.10 (0.10π).

In order to set the phase shift amount in each boundary region to a value equal to or lower than 0.10 (0.10π), the length of the boundary region (boundary portion) 30 between the diffraction gratings 2A and 2B having different periods from each other should be set to a value within ±10% from an average value of the periods. It is to be noted that the boundary region need not be provided where no phase displacement of reflected light occurs between the diffraction gratings having different periods from each other.

In other words, where the gain diffraction grating 2A and the wavelength controlling diffraction grating 2B are configured such that the periods of them are different from each other as in the case of the embodiment described above, preferably the boundary region 30 having a length within ±10% of an average value of the period of the gain diffraction grating 2A and the period of the wavelength controlling diffraction grating 2B is provided between the gain region 11A including the gain diffraction grating 2A and the wavelength controlling region 11B including the wavelength controlling diffraction grating 2B as shown in FIG. 9. It is to be noted that, since, in the embodiment described above, the gain regions 11A and the wavelength controlling regions 11B are provided alternately, a plurality of boundary regions having a length within ±10% of the average value are provided.

It is to be noted that, while, in FIG. 9, the period is defined with reference to the right side of a convex portion (mountain portion) of the diffraction gratings, the reference is not limited to this, but the period may be defined with reference to any place. For example, the period may be defined with reference to the left side or the center of a convex portion of the diffraction gratings.

For example, where the period of the gain diffraction grating 2A formed in the gain region 11A is 240.00 nm and the period of the wavelength controlling diffraction grating 2B formed in the wavelength controlling region 11B is 241.2 nm, the length of the boundary region 30 provided between the gain region 11A and the wavelength controlling region 11B is preferably set to a value within a range of ±10% of 240.6 nm which is an average value of the period of the gain diffraction grating 2A and the period of the wavelength controlling diffraction grating 2B, that is, within the range from 216.05 to 264.07 nm. By the setting, the phase shift amount by the boundary region 30 is suppressed to ±0.10π, and the phases become coincident with each other and stabilized oscillation can be anticipated.

In order to adjust the length of the boundary region 30, that is, the length between the two diffraction gratings 2A and 2B having different periods from each other, for example, an electron beam (EB) lithography system should be used to intentionally place a phase shift between the gain diffraction grating 2A of the gain region 11A and the wavelength controlling diffraction grating 2B of the wavelength controlling region 11B.

It is to be noted that, while the length of the boundary region 30 here is set to a value within ±10% of the average value of the period of the gain diffraction grating 2A and the period of the wavelength controlling diffraction grating 2B, the length of the boundary region 30 is not limited to this. For example, the length of the boundary region 30 may be set to a value obtained by adding an integral multiple of the average value of the period of the gain diffraction grating 2A and the period of the wavelength controlling diffraction grating 2B to a value within ±10% of the average value of the period of the gain diffraction grating 2A and the period of the wavelength controlling diffraction grating 2B as seen in FIG. 10.

Figure 10:
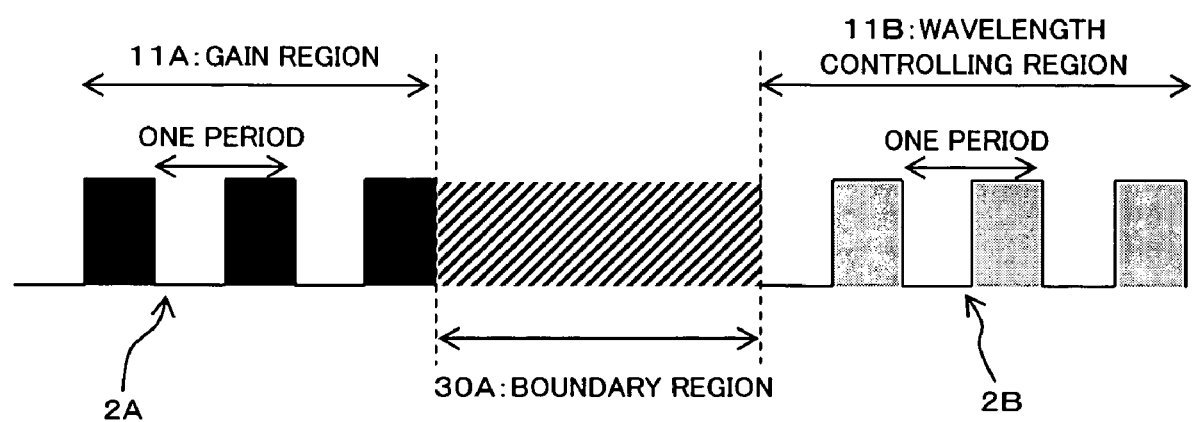
FIG. 10 is a schematic view showing another example of a configuration where a boundary region is provided in the tunable laser according to the first embodiment of the present invention.

For example, where the period of the gain diffraction grating 2A formed in the gain region 11A is 240.00 nm and the period of the wavelength controlling diffraction grating 2B formed in the wavelength controlling region 11B is 241.2 nm as seen in FIG. 10, the length of the boundary region 30A provided between the gain region 11A and the wavelength controlling region 11B is preferably set to the following value. In particular, the length of the boundary region 30A is set to a value obtained by adding an integral multiple [240.6×N (integer) (nm)] of the average value of the period of the gain diffraction grating 2A and the period of the wavelength controlling diffraction grating 2B to a value within +10% of 240.6 which is the average value of the period of the gain diffraction grating 2A and the period of the wavelength controlling diffraction grating 2B, that is, within the range from 216.05 to 264.07 nm (that is, to 216.05 to 264.07+240.6 ×N (integer) (nm)).

It is to be noted that, while, in FIG. 10, the period is defined with reference to the right side of a convex portion (mountain portion) of the diffraction gratings, the reference is not limited to this, but the period may be defined with reference to any place. For example, the period may be defined with reference to the left side or the center of a convex portion of the diffraction gratings.

In this instance, since 240.6 nm of the average value is a length corresponding to one period π and is equivalent to no phase shift, the phase shift amount by the boundary region 30A is suppressed to a value smaller than ±0.1π similarly as in the case described hereinabove wherein the length of the boundary region 30 is within ±10% of the average value. Consequently, also in this instance, the phases coincide sufficiently with each other, and stabilized oscillation can be anticipated.

Incidentally, the boundary regions 30, 30A are regions for connecting diffraction gratings having different periods from each other (here, the gain diffraction grating 2A and the wavelength controlling diffraction grating 2B) as described hereinabove.

Here, the diffraction gratings 2A and 2B having different periods from each other are provided not contiguously but in a spaced relationship from each other by a predetermined instance (by shifting one of the phases) to form the boundary region 30A in which no diffraction grating is provided between the gain region 11A and the wavelength controlling region 11B.

For example, such boundary regions 30, 30A as described above may alternatively be configured all as concave portions (valley portions) or otherwise all as convex portions (mountain portions). In other words, the boundary regions 30, 30A may be configured as concave portions of a diffraction grating which are contiguous to each other or as convex portions of a diffraction grating which are contiguous to each other.

It is to be noted that, although the boundary regions 30, 30A here are configured as a region which has no diffraction grating therein, it is not limited to those, but may be configured as a region which has a diffraction grating. For example, a diffraction grating having a period different from those of the gain diffraction grating 2A and the wavelength controlling diffraction grating 2B may be provided in the boundary regions 30, 30A. In this instance, some portion of the boundary regions 30, 30A are configured as a concave portion while the other portion is configured as a convex portion. Further, a diffraction grating may be provided in the boundary regions 30, 30A such that the period thereof changes stepwise from the period of the gain diffraction grating 2A to the period of the wavelength controlling diffraction grating 2B.

In this manner, by providing the boundary regions 30, 30A between the diffraction gratings 2A and 2B having different periods from each other, the phases of reflected light from the diffraction gratings which have different periods from each other and neighbor with each other become coincident with each other, and a stabilized oscillation state can be obtained.

Second Embodiment

Now, a tunable laser according to a second embodiment of the present invention is described with reference to FIG. 11.

The tunable laser according to the present embodiment is similar to that of the first embodiment described hereinabove except in the configuration for displacing the Bragg wavelength $\lambda_t$ of the wavelength controlling region to the long wavelength side with respect to the Bragg wavelength $\lambda_a$ of the gain region.

Figure 11:
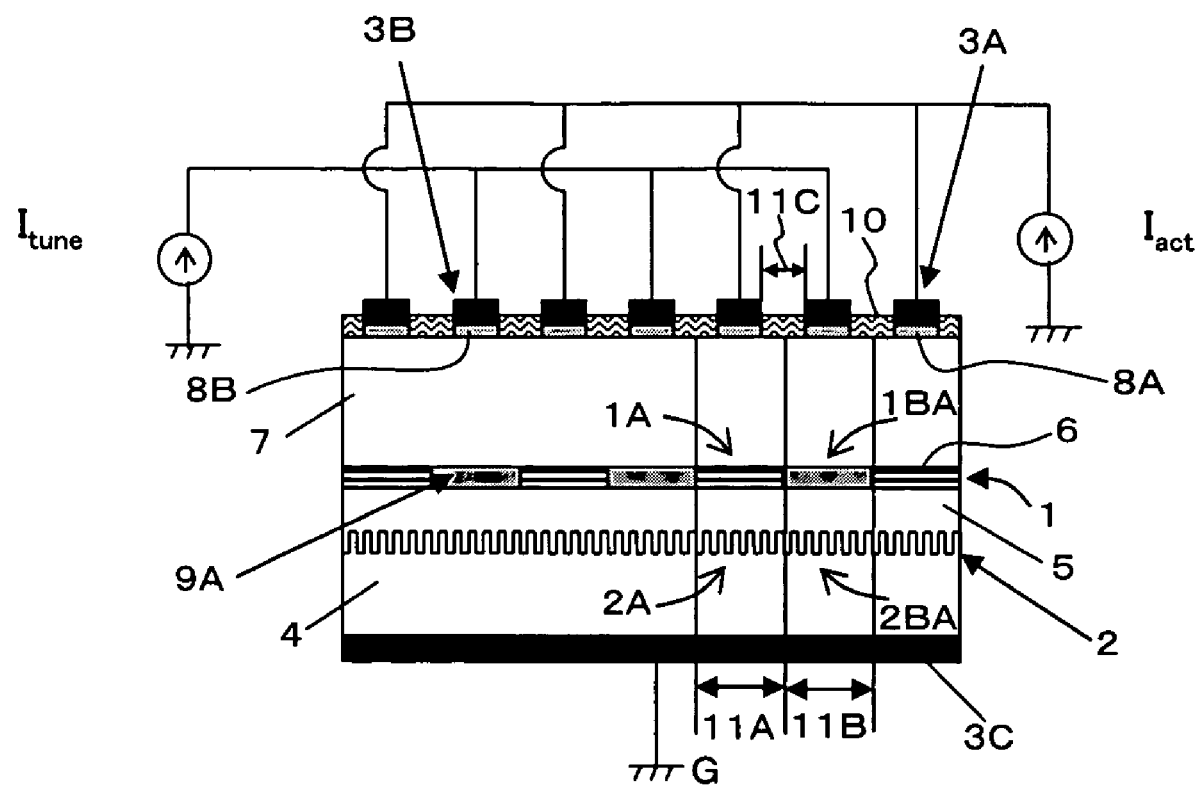
FIG. 11 is a schematic sectional view showing a configuration of a tunable laser according to a second embodiment of the present invention.

In particular, in the present embodiment, the material or composition of the core layer of the gain waveguide section 1A is adjusted so that the equivalent refractive index of the gain waveguide section 1A and the equivalent refractive index of the wavelength controlling waveguide section 1BA are made different from other as seen in FIG. 11. More particularly, the composition of the core layer of the wavelength controlling waveguide section 1BA is adjusted so that the refractive index of the core layer of the wavelength controlling waveguide section 1BA is higher than the refractive index of the core layer of the gain waveguide section 1A. It is to be noted that, in FIG. 11, similar elements to those shown in FIG. 1 are denoted by like reference characters.

By the configuration described, the Bragg wavelength $\lambda_t$ of the wavelength controlling region 11B is displaced to the long wavelength side with respect to the Bragg wavelength $\lambda_a$ of the gain region 11A within a range within which the proportion $\Delta\lambda/\lambda_a$ of the Bragg wavelength difference is within 30/L (%) ($0<\Delta\lambda/\lambda_a \leq +30/L$) in a state in which current injection into or voltage application to the wavelength controlling waveguide section 1BA is not performed.

In particular, an InGaAsP layer designed so as to have a band gap wavelength of 1.40 μm is used as the wavelength controlling layer 9A. It is to be noted that the thickness and the width of the wavelength controlling layer 9A are set equal to those in the first embodiment. By the configuration just described, the equivalent refractive index of the wavelength controlling waveguide section 1BA can be made higher by approximately 0.5% than that of the gain waveguide section 1A.

Meanwhile, the period of the diffraction grating 2 is set equal over the entire length of the optical waveguide 1, for example, to 240 nm, as seen in FIG. 11. In other words, the gain diffraction grating 2A and the wavelength controlling diffraction grating 2B have an equal period.

It is to be noted that, since the configuration of the other part is same as that of the first embodiment described hereinabove, overlapping description of the same is omitted herein to avoid redundancy.

In this manner, in the present embodiment, the period of the gain diffraction grating 2A and the period of the wavelength controlling diffraction grating 2BA are set equal to each other while the composition of the wavelength controlling waveguide section 1BA is adjusted so that the gain waveguide section 1A and the wavelength controlling waveguide section 1BA have different equivalent refractive indices from each other. In particular, the refractive index of the core layer of the wavelength controlling waveguide section 1BA is set higher than the refractive index of the core layer of the gain waveguide section 1A within a range within which the proportion $\Delta\lambda/\lambda_a$ of the Bragg wavelength difference is 30/L (%) ($0<\Delta\lambda/\lambda_a \leq +30/L$) (where the length of one period is 60 μm, 0.5%).

Consequently, the Bragg wavelength $\lambda_t$ of the wavelength controlling region 11B can be displaced to the long wavelength side with respect to the Bragg wavelength $\lambda_a$ of the gain region 11A within a range within which the proportion $\Delta\lambda/\lambda_a$ of the Bragg wavelength difference is 30/L (%) ($0<\Delta\lambda/\lambda_a \leq +30/L$) (where the length of one period is 60 μm, 0.5%) in a state in which current injection into or voltage application to the wavelength controlling waveguide section 1BA is not performed. Consequently, the continuous wavelength variable region can be used effectively while stabilized single mode oscillation is maintained.

Accordingly, with the tunable laser according to the present embodiment, there is an advantage that it can be fabricated readily and a comparatively wide wavelength variable range can be obtained by simple control. Further, since the control is simple, wavelength control can be performed at a high-speed. Particularly since the tunable laser is a current control type wavelength variable laser, it is superior in high speed responsibility.

Third Embodiment

Now, a tunable laser according to a third embodiment of the present invention is described with reference to FIG. 12.

The tunable laser according to the present embodiment is similar to that of the first embodiment described hereinabove except in the configuration for displacing the Bragg wavelength $\lambda_t$ of the wavelength controlling region to the long wavelength side with respect to the Bragg wavelength $\lambda_a$ of the gain region.

Figure 12:
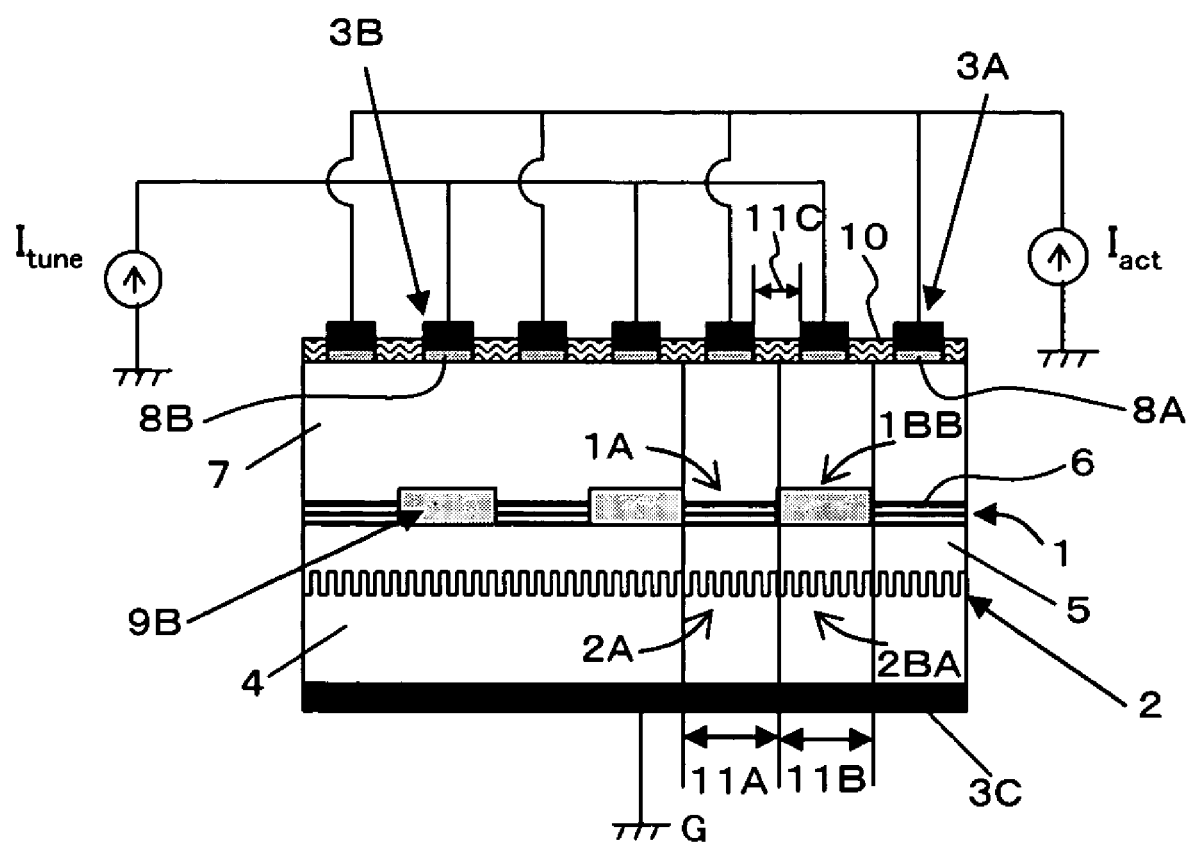
FIG. 12 is a schematic sectional view showing a configuration of a tunable laser according to a third embodiment of the present invention.

In particular, in the present embodiment, the thickness of the core layer of the gain waveguide section 1A and the thickness of the core layer of the wavelength controlling waveguide section 1BB are made different from each other to make the equivalent refractive index of the gain waveguide section 1A and the equivalent refractive index of the wavelength controlling waveguide section 1BB different from each other as seen in FIG. 12. More particularly, the thickness of the core layer of the wavelength controlling waveguide section 1BB is made thicker so that the equivalent refractive index of the wavelength controlling waveguide section 1BB may be higher than that of the gain waveguide section 1A. It is to be noted that, in FIG. 12, similar elements to those shown in FIGS. 1 and 11 are denoted by like reference characters.

By the configuration described, the Bragg wavelength $\lambda_t$ of the wavelength controlling region 11B is displaced to the long wavelength side with respect to the Bragg wavelength $\lambda_a$ of the gain region 11A within a range within which the proportion $\Delta\lambda/\lambda_a$ of the Bragg wavelength difference is within 30/L (%) ($0<\Delta\lambda/\lambda_a \leq +30/L$) in a state in which current injection into or voltage application to the wavelength controlling waveguide section 1BB is not performed.

In particular, an InGaAsP of 260 nm thick is used as the wavelength controlling layer 9B. It is to be noted that the band gap wavelength and the width of the wavelength controlling layer 9B are set equal to those in the first embodiment described hereinabove. By the configuration just described, the equivalent refractive index of the wavelength controlling waveguide section 1BB can be made higher by approximately 0.5% than that of the gain waveguide section 1A.

Meanwhile, the period of the diffraction grating 2 is set equal over the entire length of the optical waveguide 1, for example, to 240 nm, as seen in FIG. 12. In other words, the gain diffraction grating 2A and the wavelength controlling diffraction grating 2BA have an equal period.

It is to be noted that, since the configuration of the other part is same as that of the first embodiment described hereinabove, overlapping description of the same is omitted herein to avoid redundancy.

In this manner, in the present embodiment, the period of the gain diffraction grating 2A and the period of the wavelength controlling diffraction grating 2BA are set equal to each other while the thickness of the core layer is made different between the gain waveguide section 1A and the wavelength controlling waveguide section 1BB so that the equivalent refractive indices may be different from each other. In particular, the equivalent refractive index of the wavelength controlling waveguide section 1BB is set higher than the equivalent refractive index of the gain waveguide section 1A within a range within which the proportion $\Delta\lambda/\lambda_a$ of the Bragg wavelength difference is 30/L (%) ($0<\Delta\lambda/\lambda_a \leq +30/L$) (where the length of one period is 60 μm, 0.5%).

Consequently, the Bragg wavelength $\lambda_t$ of the wavelength controlling region 11B can be displaced to the long wavelength side with respect to the Bragg wavelength $\lambda_a$ of the gain region 11A within a range within which the proportion $\Delta\lambda/\lambda_a$ of the Bragg wavelength difference is 30/L (%) ($0<\Delta\lambda/\lambda_a \leq +30/L$) (where the length of one period is 60 μm, 0.5%) in a state in which current injection into or voltage application to the wavelength controlling waveguide section 1BB is not performed. Consequently, the continuous wavelength variable region can be used effectively while stabilized single mode oscillation is maintained.

Accordingly, with the tunable laser according to the present embodiment, there is an advantage that it can be fabricated readily and a comparatively wide wavelength variable range can be obtained by simple control. Further, since the control is simple, wavelength control can be performed at a high speed. Particularly since the tunable laser is a current control type wavelength variable laser, it is superior in high speed responsibility.

Fourth Embodiment

Now, a tunable laser according to a fourth embodiment of the present invention is described with reference to FIGS. 13 and 14.

The tunable laser according to the present embodiment is similar to that of the first embodiment described hereinabove except in the configuration for displacing the Bragg wavelength $\lambda_t$ of the wavelength controlling region to the long wavelength side with respect to the Bragg wavelength $\lambda_a$ of the gain region.

Figure 13:
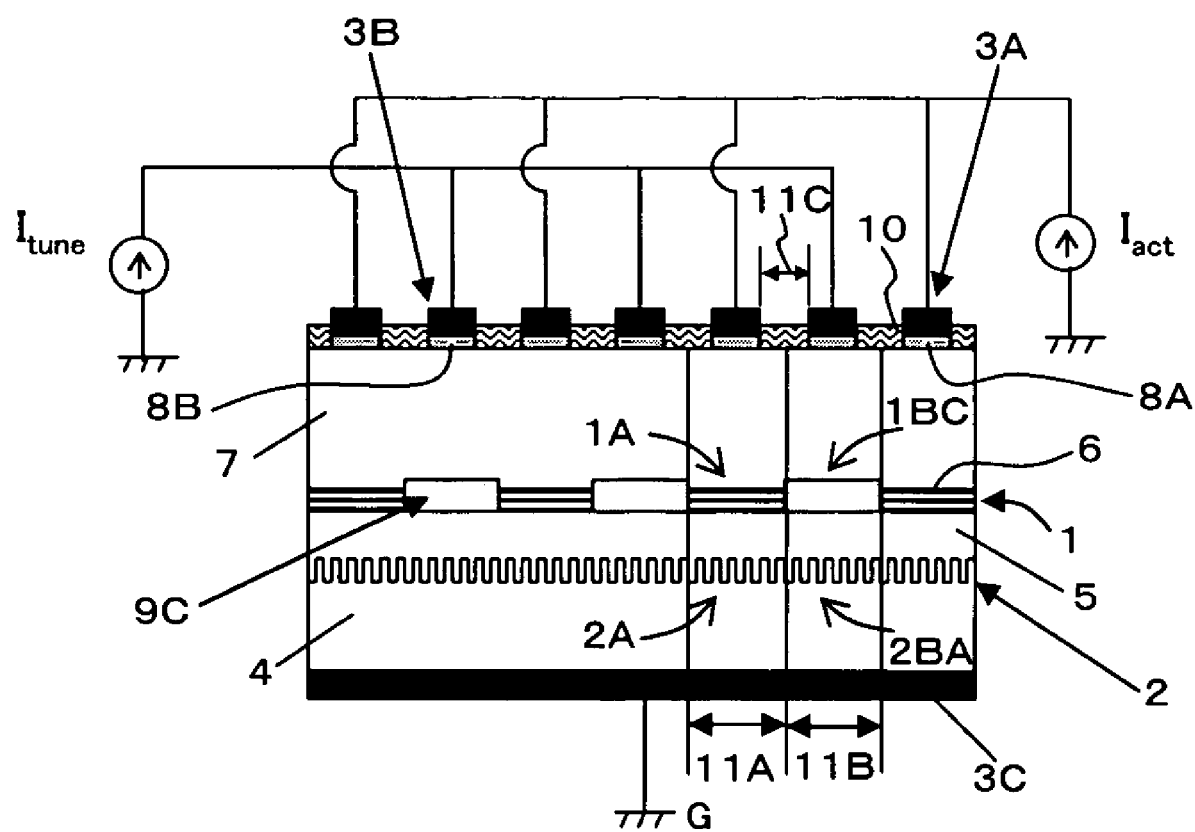
FIG. 13 is a schematic sectional view showing a configuration of a tunable laser according to a fourth embodiment of the present invention.
Figure 14:
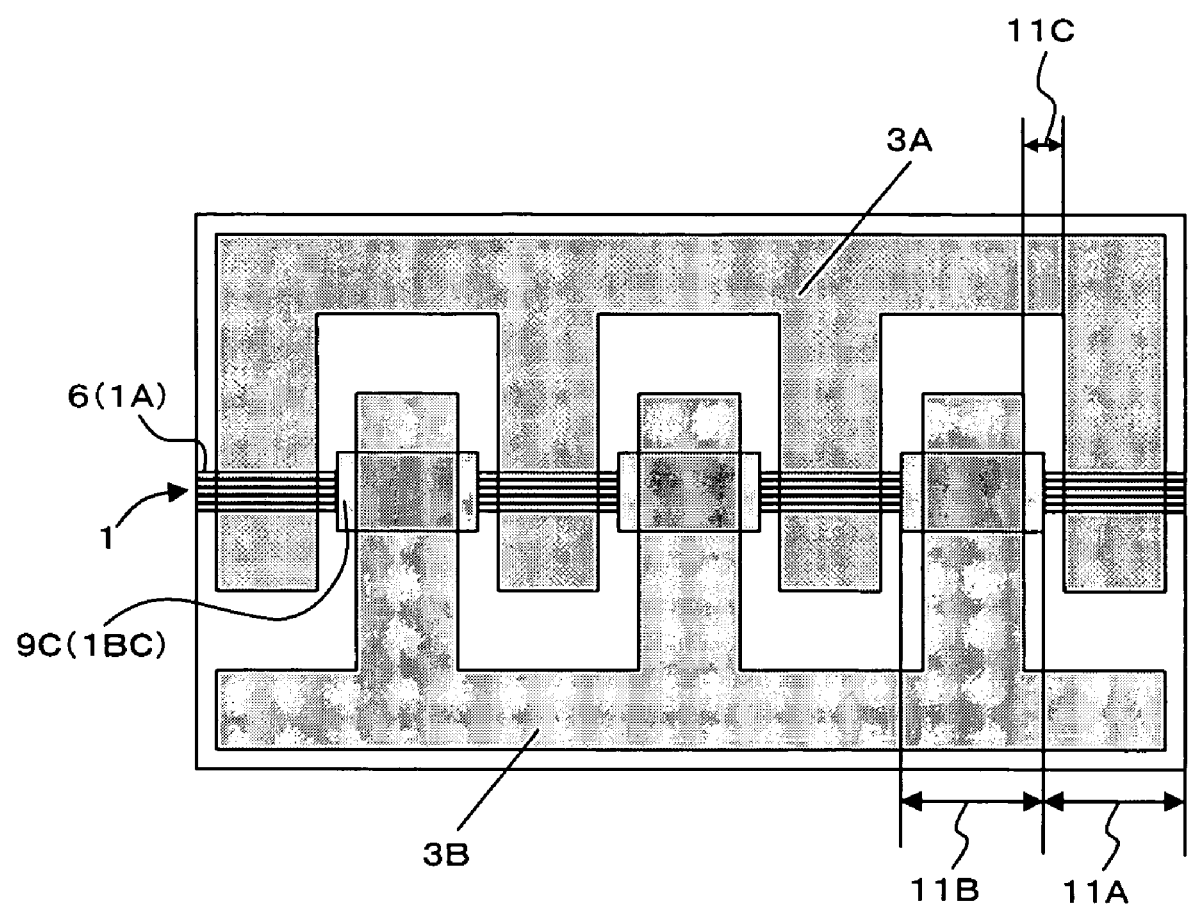
FIG. 14 is a schematic plan view showing a configuration of an electrode and a wavelength controlling waveguide in the tunable laser according to the fourth embodiment of the present invention.

In particular, in the present embodiment, the width and the thickness of the core layer of the gain waveguide section 1A and the width and the thickness of the core layer of the wavelength controlling waveguide section 1BC are made different from each other to make the equivalent refractive index of the gain waveguide section 1A and the equivalent refractive index of the wavelength controlling waveguide section 1BC different from each other as seen in FIGS. 13 and 14. More particularly, the equivalent refractive index of the wavelength controlling waveguide section 1BC is set higher than that of the gain waveguide section 1A. It is to be noted that, in FIGS. 13 and 14, similar elements to those shown in FIGS. 1 and 11 are denoted by like reference characters.

By the configuration described, the Bragg wavelength $\lambda_t$ of the wavelength controlling region 11B is displaced to the long wavelength side with respect to the Bragg wavelength $\lambda_a$ of the gain region 11A within a range within which the proportion $\Delta\lambda/\lambda_a$ of the Bragg wavelength difference is within 30/L (%) ($0\Delta\lambda/\lambda_a \leq +30/L$) in a state in which current injection into or voltage application to the wavelength controlling waveguide section 1BB is not performed.

In particular, an InGaAsP layer of 1.8 μm width and 250 nm thickness is used as the wavelength controlling layer 9C. It is to be noted that the band gap wavelength of the wavelength controlling layer 9C is set equal to that in the first embodiment described hereinabove. By the configuration just described, the equivalent refractive index of the wavelength controlling waveguide section 1BC can be made higher by approximately 0.5% than that of the gain waveguide section 1A.

Meanwhile, the period of the diffraction grating 2 is set equal over the entire length of the optical waveguide 1, for example, to 240 nm, as seen in FIG. 13. In other words, the gain diffraction grating 2A and the wavelength controlling diffraction grating 2BA have an equal period.

It is to be noted that, since the configuration of the other part is same as that of the first embodiment described hereinabove, overlapping description of the same is omitted herein to avoid redundancy.

In this manner, in the present embodiment, the period of the gain diffraction grating 2A and the period of the wavelength controlling diffraction grating 2BA are set equal to each other while the thickness and the width of the core layer are made different between the gain waveguide section 1A and the wavelength controlling waveguide section 1BC so that the equivalent refractive indices may be different from each other. In particular, the equivalent refractive index of the wavelength controlling waveguide section 1BC is set higher than the equivalent refractive index of the gain waveguide section 1A within a range within which the proportion $\Delta\lambda/\lambda_a$ of the Bragg wavelength difference is 30/L (%) ($0<\Delta\lambda/\lambda_a \leq +30/L$) (where the length of one period is 60 μm, 0.5%).

Consequently, the Bragg wavelength $\lambda_t$ of the wavelength controlling region 11B can be displaced to the long wavelength side with respect to the Bragg wavelength $\lambda_a$ of the gain region 11A within a range within which the proportion $\Delta\lambda/\lambda_a$ of the Bragg wavelength difference is 30/L (%) ($0<\Delta\lambda/\lambda_a \leq +30/L$) (where the length of one period is 60 μm, 0.5%) in a state in which current injection into or voltage application to the wavelength controlling waveguide section 1BC is not performed. Consequently, the continuous wavelength variable region can be used effectively while stabilized single mode oscillation is maintained.

Accordingly, with the tunable laser according to the present embodiment, there is an advantage that it can be fabricated readily and a comparatively wide wavelength variable range can be obtained by simple control. Further, since the control is simple, wavelength control can be performed at a high speed. Particularly since the tunable laser is a current control type wavelength variable laser, it is superior in high speed responsibility.

Fifth Embodiment

Now, a tunable laser according to a fifth embodiment of the present invention is described with reference to FIG. 15.

The tunable laser according to the present embodiment is different in the position at which a diffraction grating is provided from that of the first embodiment described hereinabove. In particular, while, in the first embodiment described hereinabove, the diffraction grating 2 is provided on the lower side of the optical waveguide 1, in the present embodiment, the diffraction grating 2 is provided on the upper side of the optical waveguide 1 as shown in FIG. 15.

Figure 15:
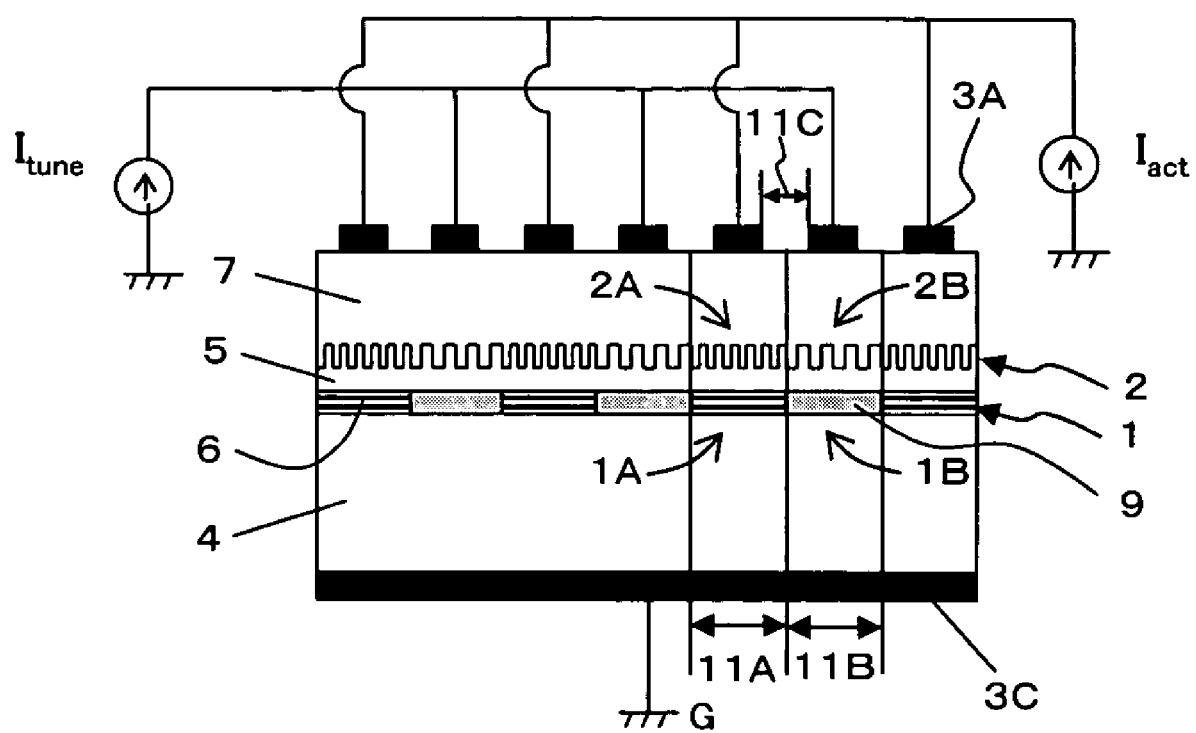
FIG. 15 is a schematic sectional view showing a configuration of a tunable laser according to a fifth embodiment of the present invention.

It is to be noted that, in FIG. 15, similar elements to those shown in FIG. 1 are denoted by like reference characters.

Where the diffraction grating 2 is provided on the upper side of the optical waveguide 1 in this manner, it is possible to form the optical waveguide 1, evaluate the composition of the optical waveguide 1 and the thickness and the width of the core layer and adjust the period of the diffraction grating 2 based on a result of the evaluation.

For example, if, in the example of the configuration of the first embodiment described hereinabove, the thickness of the core layer of the wavelength controlling waveguide section 1B formed actually is displaced from 200 nm of the designed value to 210 nm, then the equivalent refractive index becomes greater by approximately 0.1% than its designed value.

In this instance, if the period of the wavelength controlling diffraction grating 2B is set conversely from 241.2 nm of the designed value to 240.96 nm smaller by 0.1%, then the difference in the product of the equivalent refractive index and the period of the diffraction grating 2 (the Bragg wavelength is propotional to the product) between the wavelength controlling region 11B and the gain region 11A can be set to 0.5% of the designed value.

As a result, the Bragg wavelength $\lambda_t$ of the wavelength controlling region 11B can be displaced by 0.5% to the long wavelength side with respect to the Bragg wavelength $\lambda_a$ of the gain region 11A. Consequently, the continuous wavelength variable region can be used effectively while stabilized single mode oscillation is maintained.

In particular, the Bragg wavelength $\lambda_t$ of the wavelength controlling region 11B can be displaced to the long wavelength side with respect to the Bragg wavelength $\lambda_a$ of the gain region 11A within a range within which the proportion $\Delta\lambda/\lambda_a$ of the Bragg wavelength difference is 30/L (%) ($0<\Delta\lambda/\lambda_a\leq+30/L$) in a state in which current injection into or voltage application to the wavelength controlling waveguide section 1B is not performed. Consequently, the continuous wavelength variable region can be used effectively while stabilized single mode oscillation is maintained.

It is to be noted that, since the configuration of the other part is same as that of the first embodiment described hereinabove, overlapping description of the same is omitted herein to avoid redundancy.

Accordingly, with the tunable laser according to the present embodiment, there is an advantage that it can be fabricated readily and a comparatively wide wavelength variable range can be obtained by simple control. Further, since the control is simple, wavelength control can be performed at a high speed. Particularly since the tunable laser is a current control type wavelength variable laser, it is superior in high speed responsibility.

Sixth Embodiment

Now, a tunable laser according to a sixth embodiment of the present invention is described with reference to FIGS. 16 to 20.

Figure 16:
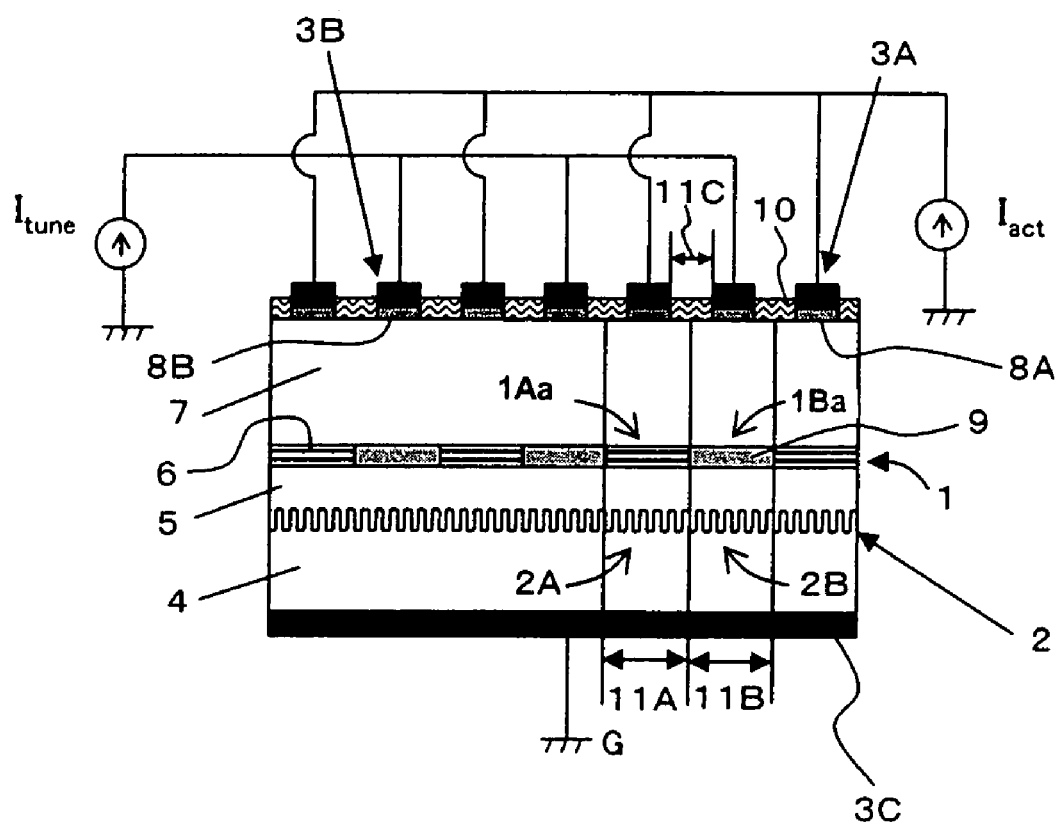
FIG. 16 is a schematic sectional view showing a configuration of a tunable laser according to a sixth embodiment of the present invention.

Referring to FIG. 16, a tunable laser (current control type tunable laser) according to the present embodiment includes an optical waveguide (optical waveguide layer) 1 having a gain waveguide section 1Aa capable of generating a gain by current injection therein and a wavelength controlling waveguide section 1Ba capable of controlling the oscillation wavelength by variation of the refractive index by current injection, and a diffraction grating (diffraction grating layer) 2 provided in the proximity of the optical waveguide 1. In the tunable laser according to the present embodiment, if current (gain controlling current) $I_{act}$ is injected into the gain waveguide section 1Aa, then laser oscillation occurs at a wavelength corresponding to the period of the diffraction grating 2. Further, the oscillation wavelength can be controlled by injecting current (wavelength controlling current) $I_{tune}$ into the wavelength controlling waveguide section 1Ba.

As shown in FIG. 16, the optical waveguide 1 is configured such that it includes gain waveguide sections (active waveguide sections) 1Aa and wavelength controlling waveguide sections 1Ba disposed alternately in the direction of an optical axial thereof. In particular, the optical waveguide 1 includes a plurality of gain waveguide sections 1Aa and a plurality of wavelength controlling waveguide sections 1Ba, and the gain waveguide sections 1Aa and the wavelength controlling waveguide sections 1Ba are disposed periodically, alternately and serially on the same plane. It is to be noted that a particular example of a configuration of the gain waveguide sections 1Aa and the wavelength controlling waveguide sections 1Ba is hereinafter described.

As shown in FIG. 16, the diffraction grating 2 is provided in parallel along the optical waveguide 1 over the entire length of the optical waveguide 1. In particular, the diffraction grating 2 is continuously provided not only at positions corresponding to the gain waveguide sections 1Aa but also at positions corresponding to the wavelength controlling waveguide sections 1Ba. It is to be noted that, as shown in FIG. 16, a portion of the diffraction grating 2 formed at each of the positions corresponding to the gain waveguide sections 1Aa is called gain diffraction grating 2A, and a portion of the diffraction grating 2 formed at each of the positions corresponding to the wavelength controlling waveguide sections 1Ba is called wavelength controlling diffraction grating 2Ba.

In this manner, in the present tunable laser, different from a TTG-DFB laser, the gain waveguide sections 1Aa and the wavelength controlling waveguide sections 1Ba are arranged on the same plane as shown in FIG. 16. Therefore, a popular device fabrication technique can be used, and the device can be fabricated easily. For example, also in a case wherein tunable lasers are integrated to produce an array integration type tunable laser as in a seventh embodiment hereinafter described, the lasers can be integrated readily.

Further, the present tunable laser has a configuration similar to that of a common DFB laser and hence is a kind of a DFB laser. Therefore, similarly to a DBR laser, phase control need not be performed upon wavelength variable control, and simple wavelength control which uses only the wavelength controlling current $I_{tune}$ can be implemented. It is to be noted that, in the present tunable laser, since the diffraction grating 2 is provided over the entire length of the optical waveguide 1, also control of the initial phase need not be performed.

As shown in FIG. 16, in the present tunable laser, electrodes 3A and 3B are provided independently of each other in respective regions of the gain waveguide sections 1Aa and the wavelength controlling waveguide sections 1Ba so that current is injected into the gain waveguide sections 1Aa and the wavelength controlling waveguide sections 1Ba of the optical waveguide 1 independently of each other, respectively.

In particular, as shown in FIG. 16, the gain electrodes (P side electrodes) 3A are formed on the upper face of the gain waveguide sections 1Aa of the optical waveguide 1 with a contact layer 8A interposed therebetween while a common electrode (N side electrode) 3C is formed below the gain waveguide sections 1Aa so that the current $I_{act}$ can be injected into an active layer (gain layer, waveguide core layer) 6 of the gain waveguide sections 1Aa. Further, wavelength controlling electrodes (P side electrodes) 3B are formed on the upper face of the wavelength controlling waveguide sections 1Ba of the optical waveguide 1 with a contact layer 8B interposed therebetween and the common electrode (N side electrode) 3C is formed below the wavelength controlling waveguide sections 1Ba so that the current $I_{tune}$ can be injected into wavelength controlling layer (waveguide core layer, phase controlling layer) 9 of the wavelength controlling waveguide sections 1Ba.

Here, the gain electrodes 3A and the wavelength controlling electrodes 3B are each configured as a comb-like electrode as shown in FIG. 2.

It is to be noted that a region configured from a gain waveguide section 1Aa, the gain diffraction grating 2Aa, a gain electrode 3A and the common electrode 3C is hereinafter referred to as gain region 11Aa, and a region configured from a wavelength controlling waveguide section 1Ba, the wavelength controlling grating 2Ba, a wavelength controlling electrode 3B and the common electrode 3C is hereinafter referred to as wavelength controlling region 11Ba.

Further, as shown in FIG. 16, a $SiO_2$ film (passivation film) 10 is formed in regions in which the contact layers 8A and 8B, wavelength controlling electrodes (P side electrodes) 3B and gain electrodes (P side electrodes) 3A are not formed. The $SiO_2$ film 10 is formed in the following manner. In particular, after the contact layers 8A and 8B are formed, the $SiO_2$ film 10 is formed on the entire face, and only the $SiO_2$ film 10 on the contact layers 8A and 8B is removed. Thereafter, the P side electrodes 3A and 3B are formed on the contact layers 8A and 8B, respectively. Consequently, the $SiO_2$ film 10 remains formed in the regions in which the contact layers 8A and 8B and the P side electrodes 3A and 3B are not formed.

Particularly, as shown in FIG. 16, in order to electrically isolate the gain regions 11Aa and the wavelength controlling regions 11Ba from each other, an isolating region (isolating section) 11C is formed between each adjacent ones of the gain electrodes 3A and the wavelength controlling electrodes 3B. In particular, the wavelength controlling electrodes (P side electrodes) 3B, gain electrodes (P side electrodes) 3A and contact layers 8A and 8B are not formed in regions above and in the proximity of joining interfaces between the gain regions 11Aa and the wavelength controlling regions 11Ba thereby to form the isolating sections 11C.

On the other hand, in the present embodiment, the total length of a gain waveguide section 1Aa and a wavelength controlling waveguide section 1Ba neighboring and paired with each other from among a plurality of gain waveguide sections 1Aa and a plurality of wavelength controlling waveguide sections 1Ba is set such that the continuous wavelength variable width where continuous oscillation can be performed in one resonance longitudinal mode is larger than the oscillation wavelength variable width where current is injected into the wavelength controlling section 1Ba. In particular, where the gain waveguide sections 1Aa and the wavelength controlling waveguide sections 1Ba are disposed periodically and alternately, where it is assumed that one gain waveguide section 1Aa and one wavelength controlling waveguide section 1Ba form one period, the length of one period is set such that the continuous wavelength variable width where continuous oscillation can be performed in one resonance longitudinal mode is larger than the oscillation wavelength variable width where current is injected into the wavelength controlling waveguide section 1Ba.

Particularly, where the wavelength controlling waveguide section 1Ba is formed from a semiconductor material and the ratio in length between a gain waveguide section 1Aa and a wavelength controlling waveguide section 1Ba which neighbors and is paired with each other is 1:X (X>0), the total length of the gain waveguide section and the wavelength controlling waveguide section which neighbor and are paired with each other is equal to or smaller than (140+30×X) μm. In other words, where the gain waveguide sections 1Aa and the wavelength controlling waveguide sections 1Ba are arranged periodically and alternately, where one period is formed from one gain waveguide section 1Aa and one wavelength controlling waveguide section 1Ba, the length of one period is set equal to or smaller than (140+30×X) μm.

Consequently, the refractive index variation which occurs in the wavelength controlling waveguide sections 1Ba can be utilized in the maximum to vary the wavelength continuously, and the continuous wavelength variable width can be expanded in the maximum.

Incidentally, as described hereinabove in connection with the first embodiment, if the reflection spectra by the diffraction grating 2 in the individual gain region 11Aa and the wavelength controlling region 11Ba are separated from each other, then oscillation at the central wavelength cannot be maintained, and mode hopping occurs, thereby the continuous wavelength variable operation cannot be performed.

Therefore, the inventor of the present invention has earnestly made an investigation and found out that the width of the wavelength within which oscillation can occur at a central wavelength of a total reflection spectrum (continuous wavelength variable width; width of the wavelength region within which oscillation can occur continuously in one resonance longitudinal mode) is nearly in inverse proportion to the length of one period where one period is formed from one gain waveguide section 1Aa and one wavelength controlling waveguide section 1Ba. It is to be noted that FIG. 17 illustrates a characteristic where the ratio between the length of the gain waveguide section 1Aa and the length of the wavelength controlling waveguide section 1Ba is 1:1 and the oscillation wavelength band is the 1.55 μm band.

Figure 17:
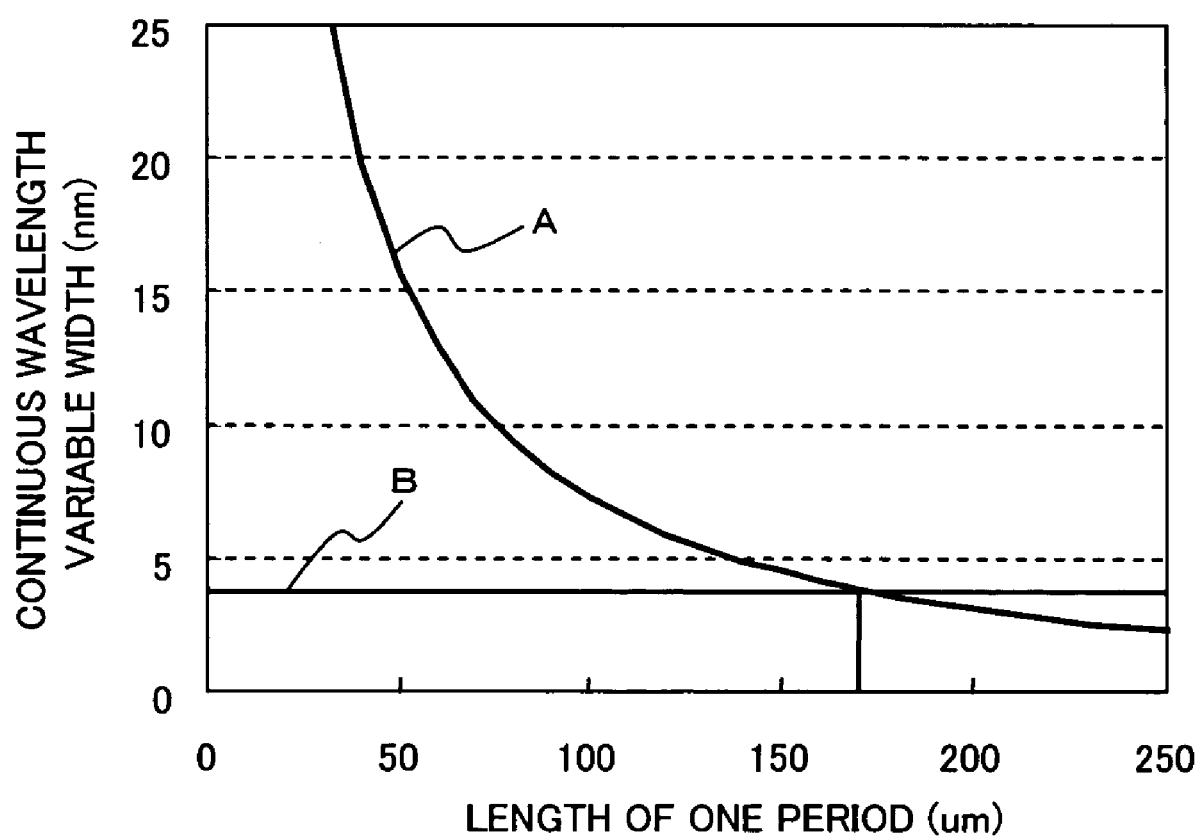
FIG. 17 is a diagram illustrating a relationship between the length of one period and the continuous wavelength variable width in the tunable laser according to the sixth embodiment of the present invention.

For example, if the variation amount of the oscillation wavelength (oscillation wavelength variable width) when current is injected into the wavelength controlling waveguide section 1Ba has a value on the lower side of the solid line A in FIG. 17, the oscillation wavelength can be continuously changed without suffering from mode hopping. However, if the variation amount has a value on the upper side of the solid line A in FIG. 17, then mode hopping appears.

Generally, although the ratio of the variation of the equivalent refractive index (maximum refractive index variation ratio) which can actually occur when current is supplied to a semiconductor waveguide varies depends also upon the structure of the waveguide, it is, for example, approximately 0.5% where an optical waveguide is formed from a semiconductor material. This corresponds to the variation amount of the equivalent refractive index (refractive index variation amount) with which the oscillation wavelength of a DBR laser or a TTG-DFB laser is varied by approximately 7 nm.

If it is assumed that the variation ratio of the equivalent refractive index of the wavelength controlling waveguide section 1Ba which is obtained when current is injected is 0.5% (that is, Δnt/nt is 0.5%), then where the Bragg wavelength before the current injection into the wavelength controlling region 11Ba is in the 1.55 μm band (that is, $\lambda_{r0}$ is 1,550 nm), the variation amount ($\Delta\lambda_{Bragg}$) of the oscillation wavelength of the present tunable laser, that is, the oscillation wavelength variable width, is approximately 3.8 nm from the expression (2) given hereinabove.

In order to allow the continuous wavelength variable operation to be performed in all regions of the wavelength variable width of the oscillation wavelength, the continuous wavelength variable width in principle of the present tunable laser should be set larger than 3.8 nm (indicated by a solid line B in FIG. 17) which is the oscillation wavelength variable width.

In order to implement this, the length of one period should be set equal to or smaller than 170 µm so that the continuous wavelength variable width may have a value on the upper side of the solid line B in FIG. 17. Where the length of one period is set equal to or smaller than 170 µm in this manner, the continuous wavelength variable width can be controlled to a value equal to or higher than 3.8 nm, and the variation of the refractive index which is caused by injection of current into the wavelength controlling waveguide section 1Ba can be utilized in the maximum to perform continuous wavelength variable operation.

In particular, if the length of one period is set larger than 170 µm, then even where it is possible to vary the oscillation wavelength to approximately 3.8 nm by injecting current into the wavelength controlling waveguide section 1Ba to vary the refractive index, mode hopping occurs with a wavelength variation amount smaller than 3.8 nm. In contrast, where the length of one period is set smaller than 170 µm, the variation of the refractive index caused by injection of current into the wavelength controlling waveguide section 1Ba can be utilized in the maximum to perform continuous wavelength variable operation.

In short, if the total length of the gain waveguide section 1Aa and the wavelength controlling waveguide section 1Ba is set such that the continuous wavelength variable width within which oscillation can occur continuously in one resonance longitudinal mode is larger than the oscillation wavelength variable width where current is injected into the wavelength controlling waveguide section 1Ba, then the variation of the refractive index caused by injection of current into the wavelength controlling waveguide section 1Ba can be utilized in the maximum to perform continuous wavelength variable operation.

In the following, a particular example of the configuration is described.

First, the gain region (active region) 11Aa has a laminated (stacked) structure wherein, for example, an n-type InP buffer layer, an n-type InGaAsP diffraction grating layer, an n-type InP buffer layer, a 1.55 µm band distortion MQW (Multiple Quantum Well) layer+SCH (Separate Confinement Heterostructure) layer (InGaAsP layer) having a band gap wavelength in the 1.55 µm band, a p-type InP cladding layer, a p-type InGaAsP contact layer and a p-type InGaAs contact layer are laminated (stacked) in order on an n-type InP substrate (semiconductor substrate).

In particular, as shown in FIG. 16, the gain region 11Aa has a laminated structure in which an n-InP layer (n-type InP substrate, n-type InP buffer layer) 4, an n-type InGaAsP diffraction grating layer 2, an n-type InP layer 5, an MQW active layer (1.55 µm band distortion MQW layer+SCH layer, waveguide core layer) 6, a p-InP layer (p-type InP cladding layer) 7, and a contact layer (p-type InGaAsP contact layer, p-type InGaAs contact layer) 8A are laminated in order.

Further, the gain waveguide section (active waveguide section) 1Aa is formed form the n-type InP layer 5, MQW active layer 6 and p-InP layer 7.

Meanwhile, the wavelength controlling region 11Ba has a laminated structure wherein, for example, an n-type InP buffer layer, an n-type InGaAsP diffraction grating layer, an n-type InP buffer layer, a 1.38 µm composition InGaAsP layer (wavelength core layer), a p-type InP cladding layer, a p-type InGaAsP contact layer and a p-type InGaAs contact layer are laminated in order on an n-type InP substrate.

In particular, the wavelength controlling region 11Ba has a laminated structure in which, as shown in FIG. 16, the n-InP layer (n-type InP substrate, n-type InP buffer layer) 4, the n-type InGaAsP diffraction grating layer 2, the n-type InP layer 5, a wavelength controlling layer (phase controlling layer; 1.38 µm composition InGaAsP core layer) 9, the p-InP layer (p-type InP cladding layer) 7 and a contact layer (p-type InGaAsP contact layer, p-type InGaAs contact layer) 8 are laminated in order.

The wavelength controlling waveguide section 1Ba is formed from the n-type InP layer 5, wavelength controlling layer 9 and p-InP layer 7.

It is to be noted that the diffraction grating 2 is formed by first laminating a layer made of a material used to form the diffraction grating layer 2 on the n-InP layer 4, removing the layer periodically using such a method as, for example, dry etching and then growing the n-type InP layer 5 on the layer.

Further, as a current blocking structure for the MQW active layer 6 and the wavelength controlling layer 9, for example, a pn-BH structure (Buried Heterostructure) may be used.

Here, the material composition and the thickness of the core layer of the wavelength controlling waveguide 1Ba are adjusted so that the equivalent refractive index of the wavelength controlling waveguide 1Ba may be equal to that of the gain waveguide section 1Aa.

Particularly, the lengths of the gain waveguide section 1Aa and the wavelength controlling waveguide section 1Ba are both set to 30 µm, and the length of one period of them is set to 60 µm. As a result, the continuous wavelength variable width in principle of the tunable laser becomes approximately 12 nm (refer to FIG. 17). It is to be noted that the device length is, for example, 570 µm. Here, the gain waveguide section 1Aa is disposed on the device end face side so that the light output may not drop. However, conversely the wavelength controlling waveguide section 1Ba may be disposed on the device end face side.

The period of the diffraction grating 2 is set, for example, to approximately 240 nm so that the oscillation wavelength may be within the 1.55 µm band.

Since the continuous wavelength variable width in principle of the tunable laser can be set to approximately 12 nm by such a configuration as described above, the wavelength variable width (approximately 3.8 nm) which may possibly be caused by the refractive index variation where current is injected into the semiconductor waveguide can be utilized in the maximum to perform a continuous wavelength variable operation.

It is to be noted that, while the embodiment described above is an example wherein the ratio between the length of the gain waveguide section 1Aa and the length of the wavelength controlling waveguide section 1Ba is set to 1:1 (in the case of X=1), the ratio between the length of the gain waveguide section 1Aa and the wavelength controlling waveguide section 1Ba is not limited to this, but substantially similar operation and effects can be achieved also where the ratio is some other value.

In particular, where the length of the wavelength controlling waveguide section 1Ba is increased, when a refractive index variation equal to that where the ratio is 1:1 is produced, although the variation amount of the oscillation wavelength increases, also the continuous wavelength variable width increases simultaneously. On the other hand, where the length of the wavelength controlling waveguide section 1Ba is decreased, when a refractive index variation equal to that where the ratio is 1:1 is produced, although the variation amount of the oscillation wavelength decreases, also the continuous wavelength variable width decreases simultaneously. Therefore, similar operation and effects to those where the ratio is 1:1 are achieved irrespective of the ratio between the length of the gain waveguide section 1Aa and the length of the wavelength controlling waveguide section 1Ba.

More particularly, where the ratio in length between the gain waveguide section 1Aa and the wavelength controlling waveguide section 1Ba is 1:X (X>0), the total length of a gain waveguide section 1Aa and a wavelength controlling waveguide section 1Ba paired with each other should be set equal to or smaller than $(140+30\times X)$ μm.

First, when the ratio in length between the gain waveguide section 1Aa and the wavelength controlling waveguide section 1Ba is 1:X (X>0), as the value of X increases (that is, as the length of the wavelength controlling waveguide section 1Ba increases), the variation amount of the oscillation wavelength when current is injected into the wavelength controlling waveguide section 1Ba to produce a refractive index variation of an equal amount increases. In other words, as the value of X increases, the wavelength variable width of the oscillation wavelength (oscillation wavelength variable width) when current is injected into the wavelength controlling waveguide section 1Ba increases.

Figure 18:
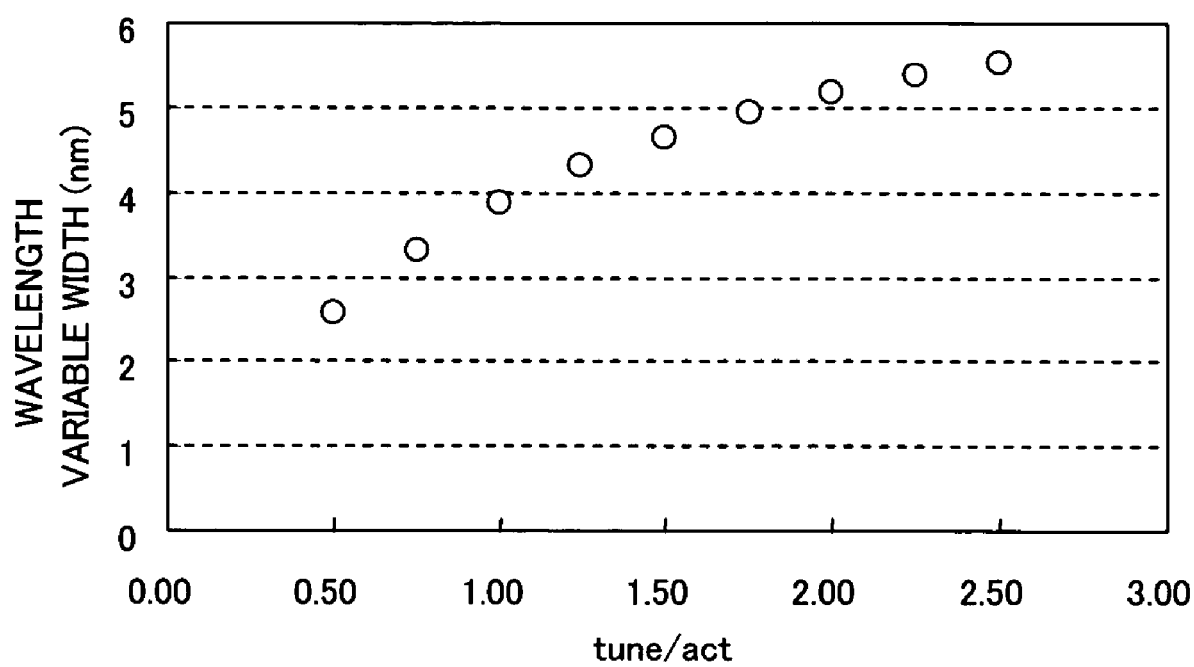
FIG. 18 is a diagram illustrating a relationship between the ratio between the lengths of a wavelength controlling waveguide section and a gain waveguide section paired with each other and the wavelength variable width in the tunable laser according to the sixth embodiment of the present invention.

FIG. 18 illustrates a relationship between the ratio 1:X (X>0) in length between the gain waveguide section 1Aa and the wavelength controlling waveguide section 1Ba and the wavelength variable width where the variation ratio of the equivalent refractive index of the wavelength controlling waveguide section 1Ba which is obtained when current is injected into the wavelength controlling waveguide section 1Ba is 0.5%.

It is to be noted here that, in FIG. 18, the ratio "tune/act" is illustrated where "act" is the length of the gain waveguide section 1Aa and "tune" is the length of the wavelength controlling waveguide section 1Ba. Here, if the length "act" of the gain waveguide section 1Aa is set to 1, then since the length "tune" of the wavelength controlling waveguide section 1Ba is given by X, the value of the ratio "tune/act" is given by X.

As can be seen from FIG. 18, for example, where X=1, that is, where the ratio between the length of the gain waveguide section 1Aa and the length of the wavelength controlling waveguide section 1Ba is 1:1 ("tune/act"=1), the wavelength variable width is approximately 3.8 nm, whereas, where X=2, that is, where the ratio between the length of the gain waveguide section 1Aa and the length of the wavelength controlling waveguide section 1Ba is 1:2 ("tune/act"=2), the wavelength variable width is approximately 5.2 nm. Thus, it can be recognized that, as the value of X increases, the wavelength variable width increases.

On the other hand, as the value of X increases (that is, as the length of the wavelength controlling waveguide section 1Ba increases), also there is a tendency that the continuous wavelength variable width within which the wavelength can be varied while appearance of mode hopping is prevented increases.

Figure 19:
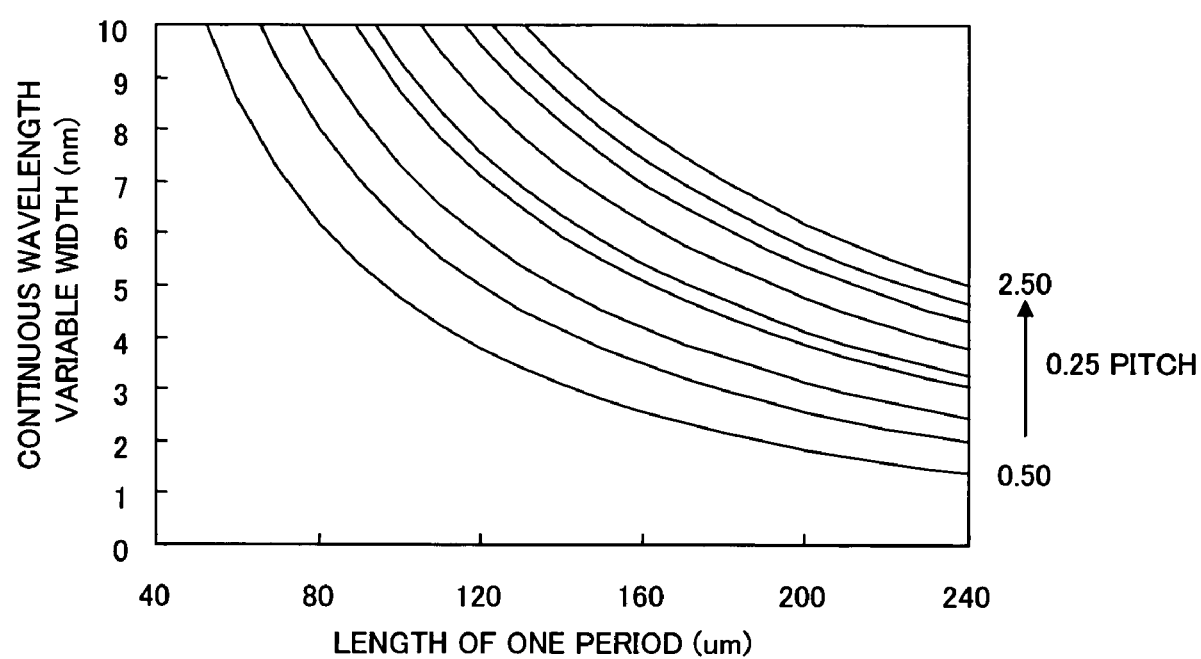
FIG. 19 is a diagram illustrating a relationship among the length of one period, the continuous wavelength variable width and the ratio between the lengths of a wavelength controlling waveguide section and a gain waveguide section paired with each other in the tunable laser according to the sixth embodiment of the present invention.

FIG. 19 illustrates a relationship between the total length (length of one period) of a gain waveguide section 1Aa and a wavelength controlling waveguide section 1Ba paired with each other and the continuous wavelength variable width where the ratio 1:X (X>0) (here, the value of "tune/act") between the length of the gain waveguide section 1Aa and the length of the wavelength controlling waveguide section 1Ba is successively varied from 0.50 to 2.50 with a step size of 0.25.

As can be seen from FIG. 19, there is a tendency that, where the length of one period is equal (that is, the length of a gain, waveguide section 1Aa and a wavelength controlling waveguide section 1Ba paired with each other is equal), as the value of X increases (that is, the value of "tune/act" increases; as the length of the wavelength controlling waveguide section 1Ba increases), the continuous wavelength variable width increases.

Incidentally, if the total length (length of one period) of a gain waveguide section 1Aa and a wavelength controlling waveguide section 1Ba paired with each other, hereinafter referred to as total length Y, with which the continuous wavelength variable width is larger than the oscillation wavelength variable width where the variation ratio of the equivalent refractive index of the wavelength controlling waveguide section 1Ba which is obtained when current is injected into the wavelength controlling waveguide section 1Ba is 0.5% similarly as in the case wherein the ratio in length between the gain waveguide section 1Aa and the wavelength controlling waveguide section 1Ba is 1:1 (refer to FIG. 17) is calculated, then it can be recognized that the total length (length of one period) Y of a gain waveguide section 1Aa and a wavelength controlling waveguide section 1Ba paired with each other can be approximated by an expression $Y=(140+30\times X)$ (μm) as seen from FIG. 20.

Figure 20:
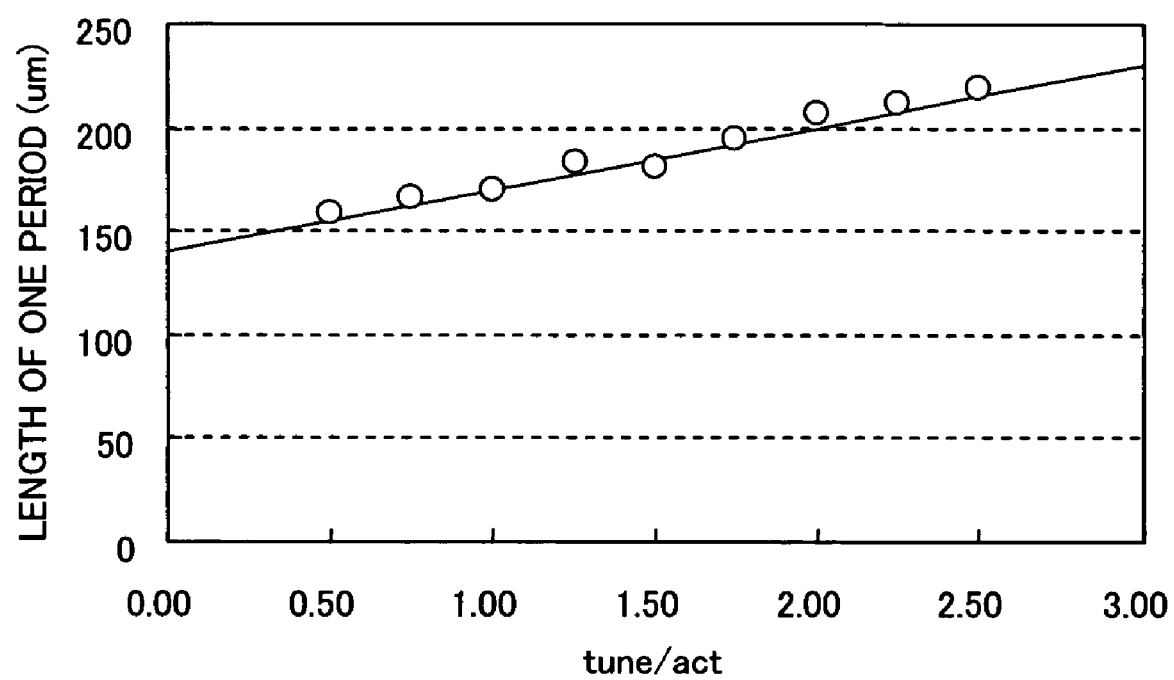
FIG. 20 is a diagram illustrating a relationship between the ratio between the lengths of a wavelength controlling waveguide section and a gain waveguide section paired with each other and the maximum value of the length of one period in the tunable laser according to the sixth embodiment of the present invention.

In particular, if the total length (length of one period) Y (μm) (permissible maximum value) of a gain waveguide section 1Aa and a wavelength controlling waveguide section 1Ba paired with each other with which the continuous wavelength variable width and the oscillation wavelength variable width exhibit equal values to each other is determined from FIGS. 18, 19 and this is plotted in a coordinated relationship with the ratio 1:X (X>0) in length (here, the value of "tune/act") between the gain waveguide section 1Aa and the wavelength controlling waveguide section 1Ba as seen in FIG. 20, then the total length Y can be approximated by the expression $Y=(140+30\times X)$.

Accordingly, if the total length (length of one period) of a gain waveguide section 1Aa and a wavelength controlling waveguide section 1Ba paired with each other is set equal to or smaller than $(140+30\times X)$ μm, then the variation of the refractive index caused by injection of current into the wavelength controlling waveguide section 1Ba can be utilized in the maximum to perform a continuous wavelength variable operation.

Further, while, in the embodiment described above, the length of the plural gain waveguide sections 1Aa and the length of the plural wavelength controlling waveguide sections 1Ba are all set equal to each other so that the periods of them are all set equal to each other, the relationship of the lengths of them are not limited to this, but only it is necessary to set the length of the longest period (total length of the gain waveguide section 1Aa and the wavelength controlling waveguide section 1Ba with which the period is longest) so as to satisfy the condition described hereinabove.

Further, while the embodiment described above presupposes a wavelength variable laser whose oscillation wavelength band is the 1.55 μm band, the application of the present invention is not limited to this. For example, the present invention can be applied also to a wavelength variable laser of some other oscillation wavelength band such as, for example, the 1.3 up band.

In particular, if the oscillation wavelength band changes, then although the characteristic of the continuous wavelength variable width with respect to the length of one period varies (refer to FIG. 17), since also the variation amount of the oscillation wavelength where the maximum variation ratio of the equivalent refractive index of the wavelength controlling waveguide section 1Ba varies changes, if the length of one period is set equal to or smaller than (140+30×X) μm similarly as in the case of the embodiment described above, then the variation of the refractive index caused by injection of current into the wavelength controlling waveguide section 1Ba can be utilized in the maximum to perform continuous wavelength variable operation.

After all, if the gain waveguide sections 1Aa and the wavelength controlling waveguide sections 1Ba are configured such that the total length of a gain waveguide section 1Aa and a wavelength controlling waveguide section 1Ba paired with each other is set so that the continuous wavelength variable width with which oscillation can continuously occur in one resonance longitudinal mode is larger than the oscillation wavelength variable width when current is injected into the wavelength controlling waveguide section 1Ba, then the variation of the refractive index caused by injection of current into the wavelength controlling waveguide section 1Ba can be utilized in the maximum to perform continuous wavelength variable operation.

Seventh Embodiment

Figure 21:
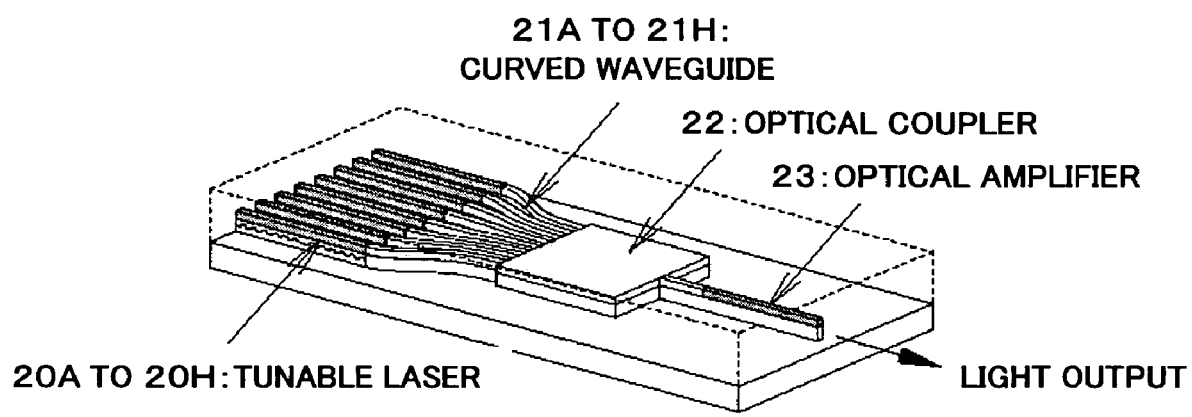
FIG. 21 is a schematic view showing a configuration of an array integration type tunable laser according to a seventh embodiment of the present invention.
Figure 22:
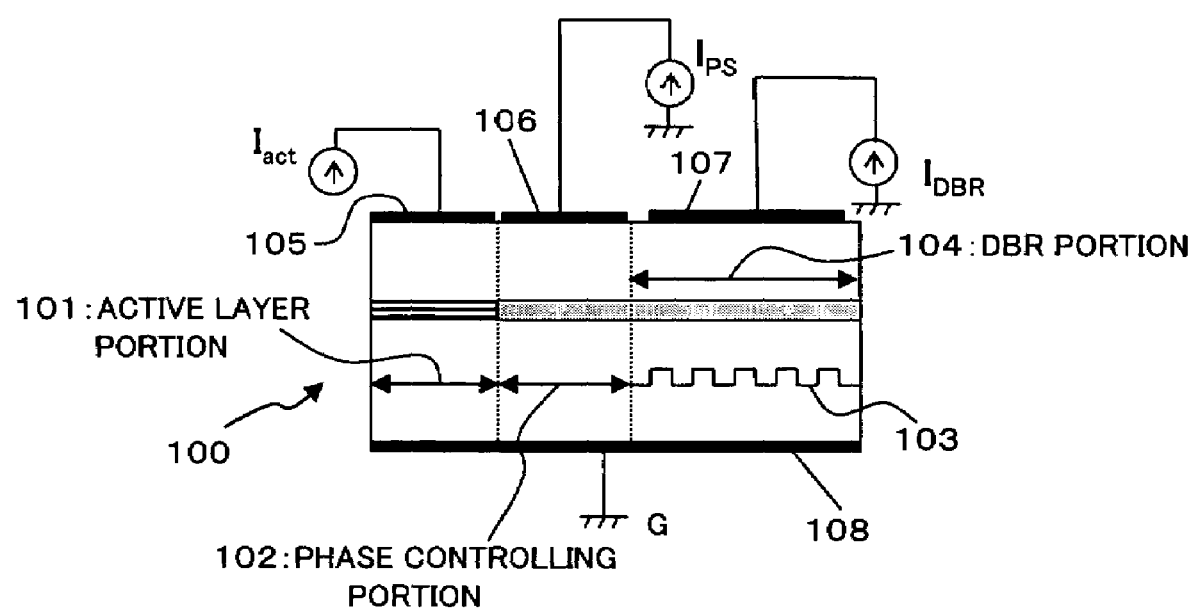
FIG. 22 is a schematic sectional view showing a configuration of a conventional 3-electrode DBR laser.
Figure 23:
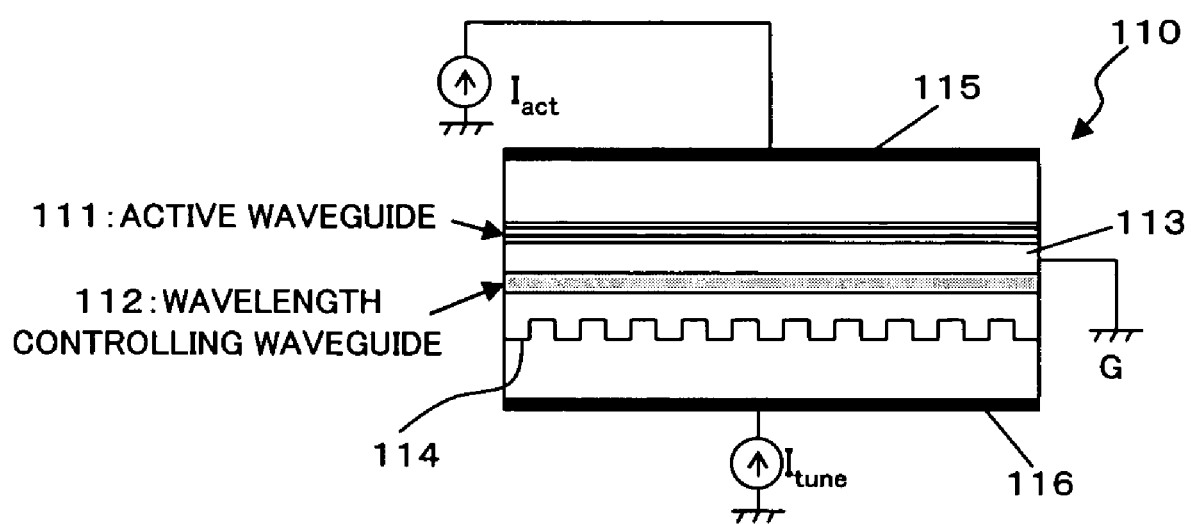
FIG. 23 is a schematic sectional view showing a configuration of a conventional TTG-DFB laser.

Now, a tunable laser according to a seventh embodiment of the present invention is described with reference to FIG. 21.

The tunable laser of the present embodiment is an array integration type tunable laser and includes a plurality of wavelength variable lasers of any of the embodiments described hereinabove which are integrated in one device.

In particular, the present tunable laser includes a plurality of (eight in the arrangement shown) wavelength variable lasers 20A to 20H having different wavelength variable ranges, a plurality of (eight in the arrangement shown) curved waveguides 21A to 21H, an optical coupler (mulit-plexer) 22, and an optical amplifier (semiconductor optical amplifier) 23, all provided on the same substrate.

The wavelength variable lasers 20A to 20H individually have predetermined continuous wavelength variable ranges, for example, equal to or larger than 6 nm. Consequently, a tunable laser having a wavelength variable range of 40 nm can be implemented in the form of a single device. As a result, a tunable laser which can cover the entire range of 1, 530 to 1, 560 nm (C band) which is important for a WDM communication system can be implemented.

Further, the wavelength variable lasers 20A to 20H are configured such that the oscillation wavelengths thereof are different, for example, by 5 nm from each other in a state in which current injection into or voltage application to the wavelength controlled waveguide sections is not performed.

The wavelength variable lasers 20A to 20H are connected to the optical amplifier 23 through the curved waveguides 21A to 21H and the optical coupler 22, respectively.

It is to be noted that the curved waveguides 21A to 21H and the optical coupler 22 are configured so as to have a laminated (stacked) structure (refer to the embodiments described hereinabove) similar to that of the wavelength controlling regions of the wavelength variable lasers 20A to 20H. Meanwhile, the optical amplifier 23 is configured so as to have a lamination (stacked) structure (refer to the embodiments described hereinabove) similar to that of the gain regions of the wavelength variable lasers 20A to 20H.

Accordingly, since the wavelength variable lasers integrated in the array integration type tunable laser according to the present embodiment are the wavelength variable lasers of the embodiments described hereinabove, it is advantageous in that they can be fabricated readily and a comparatively wide wavelength variable range is obtained by simple control. Further, since the wavelength variable lasers can be controlled simply, there is another advantage that wavelength control can be performed at a high speed. Therefore, there is an advantage that it is easy to fabricate the array integration type tunable laser of the present embodiment. Further, there is an advantage that control upon changeover between lasers is simple and wavelength control can be performed at a high speed.

Others

While, in the embodiments from first to fifth described above, the ratio between the length of the gain waveguide section 1A and the length of the wavelength controlling waveguide section 1B is 1:1, the ratio between the length of the gain waveguide section 1A and the length of the wavelength controlling waveguide section 1B is not limited to this.

It is to be noted, however, that, where the ratio between the length of the gain waveguide section 1A and the length of the wavelength controlling waveguide section 1B has a value other than 1:1, the upper limit value where the Bragg wavelength $\lambda_t$ of the wavelength controlling region 11B is displaced to the long wavelength side with respect to the Bragg wavelength $\lambda_a$ of the gain region 11A in a state in which current injection into or voltage application to the wavelength controlling waveguide section 1B is different from those in the embodiments described hereinabove.

More particularly, since the continuous wavelength variable width increases as the ratio occupied by the wavelength controlling waveguide section 1B increases, the upper limit value where the Bragg wavelength $\lambda_t$ of the wavelength controlling region 11B is displaced to the long wavelength side with respect to the Bragg wavelength $\lambda_a$ of the gain region 11A can be increased. On the contrary, since the continuous wavelength variable width decreases as the ratio occupied by the wavelength controlling waveguide section 1B decreases, the upper limit value where the Bragg wavelength $\lambda_t$ of the wavelength controlling region 11B is displaced to the long wavelength side with respect to the Bragg wavelength $\lambda_a$ of the gain region 11A can be decreased.

For example, where the ratio between the length of the gain waveguide section 1A and the length of the wavelength controlling waveguide section 1B is set to 4:6, since the ratio occupied by the wavelength controlling waveguide section 1B increases and the continuous wavelength variable width increases, in order to perform a continuous wavelength variable operation, where the total length (length of one period) of a gain waveguide section 1A and a wavelength controlling waveguide section 1B neighboring and paired with each other is set to L (μm), the proportion $\Delta\lambda/\lambda_a$ of the Bragg wavelength difference should be set to $-35/L \leq \Delta\lambda/\lambda_a \leq +35/L$. Accordingly, if the Bragg wavelength $\lambda_t$ of the wavelength controlling region 11B is displaced to the long wavelength side with respect to the Bragg wavelength $\lambda_a$ of the gain region 11A such that the proportion $\Delta\lambda/\lambda_a$ of the Bragg wavelength difference is within a range of 35/L (%)

($0<\Delta\lambda/\lambda_a\leq+35/L$) in a state in which current injection into or voltage application to the wavelength controlling waveguide section 1B is not performed, then the continuous wavelength variable region can be used effectively while stabilized single mode oscillation is maintained.

On the contrary, where the ratio between the length of the gain waveguide section 1A and the length of the wavelength controlling waveguide section 1B is set to 6:4, since the ratio occupied by the wavelength controlling waveguide section 1B decreases and the continuous wavelength variable width decreases, where the total length (length of one period) of a gain waveguide section 1A and a wavelength controlling waveguide section 1B neighboring and paired with each other is set to L (μm), the proportion $\Delta\lambda/\lambda_a$ of the Bragg wavelength difference should be set to $-28/L \leq \Delta\lambda/\lambda_a \leq +28/L$. Accordingly, if the Bragg wavelength $\lambda_t$ of the wavelength controlling region 11B is displaced to the long wavelength side with respect to the Bragg wavelength $\lambda_a$ of the wavelength controlling region 11B such that the proportion $\Delta\lambda/\lambda_a$ of the Bragg wavelength difference is within a range of 28/L (%) ($0<\Delta\lambda/\lambda_a\leq+28/L$) in a state in which current injection into or voltage application to the wavelength controlling waveguide section 1B is not performed, then the continuous wavelength variable region can be used effectively while stabilized single mode oscillation is maintained.

In short, if the ratio between the length of the gain waveguide section 1A and the length of the wavelength controlling waveguide section 1B changes, then since the continuous wavelength variable width varies, the range of the proportion $\Delta\lambda/\lambda_a$ of the Bragg wavelength difference should be set in response to the ratio between the length of the gain waveguide section 1A and the length of the wavelength controlling waveguide section 1B while an upper limit value where the Bragg wavelength $\lambda_t$ of the wavelength controlling region 11B is displaced to the long wavelength side with respect to the Bragg wavelength $\lambda_a$ of the gain region 11A is set.

Further, while, in the embodiments described above, the length of the plural gain waveguide sections 1A and the length of the plural wavelength controlling waveguide sections 1B are all set equal to each other so that the periods of them are all set equal to each other, the relationship of the lengths of them are not limited to this, but only it is necessary to set the length of the longest period (total length of the gain waveguide section 1A and the wavelength controlling waveguide section 1B with which the period is longest) so as to satisfy the condition described hereinabove.

Further, while the embodiments described above presuppose a wavelength variable laser whose oscillation wavelength band is the 1.55 μm band, the application of the present invention is not limited to this. For example, the present invention can be applied also to a wavelength variable laser of some other oscillation wavelength band such as, for example, the 1.3 μm band.

Further, while, in the embodiments from fisrt to fifth described hereinabove, the period of the diffraction grating, the composition, thickness or thickness and width of the core layer of the optical waveguide is made different between the wavelength controlling regions and the gain regions to adjust the Bragg wavelength of the gain regions and the Bragg wavelength of the wavelength controlling regions, naturally the parameters used in the embodiments may be combined arbitrarily to perform the adjustment of the Bragg wavelength. Since the Bragg wavelength increases in proportion to the product of the equivalent refractive index of the optical waveguide and the period of the diffraction grading, the product should be set such that the proportion $\Delta\lambda/\lambda_a$ of the Bragg wavelength difference is higher within a predetermined range in the wavelength controlling regions than in the gain regions.

Further, while, in the embodiments described above, an InGaAsP type material is used, the material is not limited to this, but also it is possible to use other semiconductor materials such as, for example, an InGaAlAs type material or a GaInNAs type material. Also in this instance, similar effects can be anticipated.

The present invention is not limited to the embodiments specifically described above, and variations and modifications can be made without departing from the scope of the present invention.

What is claimed is:

1. A tunable laser, comprising:
    an optical waveguide alternately including a gain waveguide portion capable of generating a gain and a wavelength controlling waveguide portion capable of controlling the oscillation wavelength by current injection or voltage application without generating a gain in the optical axis direction; and
    a diffraction grating provided along said optical waveguide over the entire length of said optical waveguide;
    said diffraction grating including a gain diffraction grating provided at a position corresponding to the gain waveguide portion and a wavelength controlling diffraction grating provided at a position corresponding to the wavelength controlling waveguide;
    a wavelength controlling region being configured such that the wavelength controlling waveguide portion and the wavelength controlling diffraction grating are included therein;
    a gain region being configured such that the gain waveguide portion and the gain diffraction grating are included therein;
    the Bragg wavelength of said wavelength controlling region being longer than that of said gain region in a state in which current injection or voltage application is not performed for the wavelength controlling waveguide portion.

2. The tunable laser as claimed in claim 1, wherein the period of the gain diffraction grating and the period of the wavelength controlling diffraction grating are different from each other.

3. The tunable laser as claimed in claim 2, wherein a boundary region is provided between said gain region and said wavelength controlling region, and
    the length of said boundary region has a value within±10% of an average value between the period of the gain diffraction grating and the period of the wavelength controlling diffraction grating or a value obtained by adding a value given by integral multiple of the average value to the value within±10% of the average value.

4. The tunable laser as claimed in claim 1, wherein the equivalent refractive index of the gain waveguide portion and the equivalent refractive index of the wavelength controlling waveguide portion are different from each other.

5. The tunable laser as claimed in claim 4, wherein the material or composition of a core layer of the gain waveguide portion or the material or composition of a core layer of the wavelength controlling waveguide portion are different from each other.

6. The tunable laser as claimed in claim 4, wherein the thickness of said core layer of the gain waveguide portion and the thickness of said core layer of the wavelength controlling waveguide portion are different from each other.

7. The tunable laser as claimed in claim 4, wherein the width of said core layer of the gain waveguide portion and the width of said core layer of the wavelength controlling waveguide portion are different from each other.

8. The tunable laser as claimed in claim 1, wherein said diffraction grating includes a $\lambda/4$ phase shift portion at a central position in the longitudinal direction thereof.

9. The tunable laser as claimed in claim 1, wherein said diffraction grating is formed on the upper side of said optical waveguide.

10. The tunable laser as claimed in claim 1, further comprising:
   a gain electrode for injecting current into the gain waveguide portion; and
   a wavelength controlling electrode for performing current injection or voltage application into or to the wavelength controlling waveguide;
   said gain electrode and said wavelength controlling electrode being provided independently of each other.

11. The tunable laser as claimed in claim 10, wherein both of said gain electrode and said wavelength controlling electrode are comb-like electrodes.

12. A tunable laser, comprising:
   an optical waveguide alternately including a gain waveguide portion capable of generating a gain and a wavelength controlling waveguide portion capable of controlling the oscillation wavelength by current injection or voltage application without generating a gain in the optical axis direction; and
   a diffraction grating provided along said optical waveguide over the entire length of said optical waveguide;
   the total length of the gain waveguide portion and wavelength controlling waveguide portion paired with each other to form said optical waveguide being set such that the continuous wavelength variable width which is width of the wavelength region being able to oscillate continuously in a resonance longitudinal mode without causing mode hopping is larger than the oscillation wavelength variable width which is the variation amount of the oscillation wavelength where current is injected into the wavelength controlling waveguide portion.

13. A tunable laser, comprising:
   an optical waveguide alternately including a gain waveguide portion capable of generating a gain and a wavelength controlling waveguide portion capable of controlling the oscillation wavelength by current injection without generating a gain in the optical axis direction; and
   a diffraction grating provided along said optical waveguide over the entire length of said optical waveguide;
   the wavelength controlling waveguide portion being formed from a semiconductor material;
   the ratio in length between the gain waveguide portion and the wavelength controlling waveguide portion paired with each other being 1:X, X being larger than 0, the total length of the gain waveguide portion and the wavelength controlling waveguide portion paired with each other being $(140+30 \times X)$ µm or less.

14. The tunable laser as claimed in claim 12, further comprising:
   a gain electrode for performing current injection into the gain waveguide portion; and
   a wavelength controlling electrode for performing current injection into the wavelength controlling waveguide portion;
   said gain electrode and said wavelength controlling electrode being provided independently of each other.

15. The tunable laser as claimed in claim 14, wherein both of said gain electrode and said wavelength controlling electrode are comb-like electrodes.

16. The tunable laser as claimed in claim 12, wherein said diffraction grating includes a $\lambda/4$ phase shift portion at a central position in the longitudinal direction thereof.

17. An array integration type tunable laser, comprising:
   a plurality of tunable lasers provided on a common substrate and having wavelength variable ranges different from each other; each of said tunable lasers comprising:
   an optical waveguide alternately including a gain waveguide portion capable of generating a gain and a wavelength controlling waveguide portion capable of controlling the oscillation wavelength by current injection or voltage application without generating a gain in the optical axis direction; and
   a diffraction grating provided along said optical waveguide over the entire length of said optical waveguide;
   said diffraction grating including a gain diffraction grating provided at a position corresponding to the gain waveguide portion and a wavelength controlling diffraction grating provided at a position corresponding to the wavelength controlling waveguide;
   a wavelength controlling region being configured such that the wavelength controlling waveguide portion and the wavelength controlling diffraction grating are included therein;
   a gain region being configured such that the gain waveguide portion and the gain diffraction grating are included therein;
   the Bragg wavelength of said wavelength controlling region being longer than that of said gain region in a state in which current injection or voltage application is not performed for the wavelength controlling waveguide portion.

* * * * *